(12) United States Patent
Carroll et al.

(10) Patent No.: US 8,552,558 B2
(45) Date of Patent: *Oct. 8, 2013

(54) CONDUCTIVE COMPOSITIONS AND PROCESSES FOR USE IN THE MANUFACTURE OF SEMICONDUCTOR DEVICES

(75) Inventors: Alan Frederick Carroll, Raleigh, NC (US); Kenneth Warren Hang, Hillsborough, NC (US); Brian J. Laughlin, Apex, NC (US); Yueli Wang, Morrisville, NC (US)

(73) Assignee: E I du Pont de Nemours and Company, Wilmington, DE (US)

( * ) Notice: Subject to any disclaimer, the term of this patent is extended or adjusted under 35 U.S.C. 154(b) by 1215 days.

This patent is subject to a terminal disclaimer.

(21) Appl. No.: 12/254,189

(22) Filed: Oct. 20, 2008

(65) Prior Publication Data

US 2009/0101199 A1 Apr. 23, 2009

Related U.S. Application Data

(60) Provisional application No. 60/980,855, filed on Oct. 18, 2007.

(51) Int. Cl.
*H01L 29/45* (2006.01)
*H01L 31/0224* (2006.01)

(52) U.S. Cl.
USPC .......... 257/741; 136/256; 257/734; 257/772; 257/762; 438/597; 438/98; 438/453

(58) Field of Classification Search
USPC ............................ 136/256, 244, 252; 438/98
See application file for complete search history.

(56) References Cited

U.S. PATENT DOCUMENTS

| | | | | |
|---|---|---|---|---|
| 4,101,710 | A * | 7/1978 | Marcus | 428/472 |
| 4,699,888 | A | 10/1987 | Dumesnil et al. | |
| 5,121,298 | A * | 6/1992 | Sarma et al. | 361/774 |
| 5,176,853 | A | 1/1993 | Sarma et al. | |
| 2006/0102228 | A1* | 5/2006 | Sridharan et al. | 136/256 |

FOREIGN PATENT DOCUMENTS

JP 2001-118425 * 4/2001

OTHER PUBLICATIONS

Sokolov et al., Electrical Properties and teh Structure of Halogen-Containing Lead Borate Glasses: II. The PbF2—PbO—B2O3 System, Glass Physics and Chemistry, vol. 28, No. 5, pp. 303-308 (2002).*

* cited by examiner

*Primary Examiner* — Jennifer Michener
*Assistant Examiner* — Jayne Mershon

(57) ABSTRACT

The present invention is directed to a thick film conductive composition comprising: (a) electrically conductive silver powder; (c) fluorine-containing glass frit; dispersed in (d) organic vehicle and devices made therefrom.

8 Claims, 20 Drawing Sheets

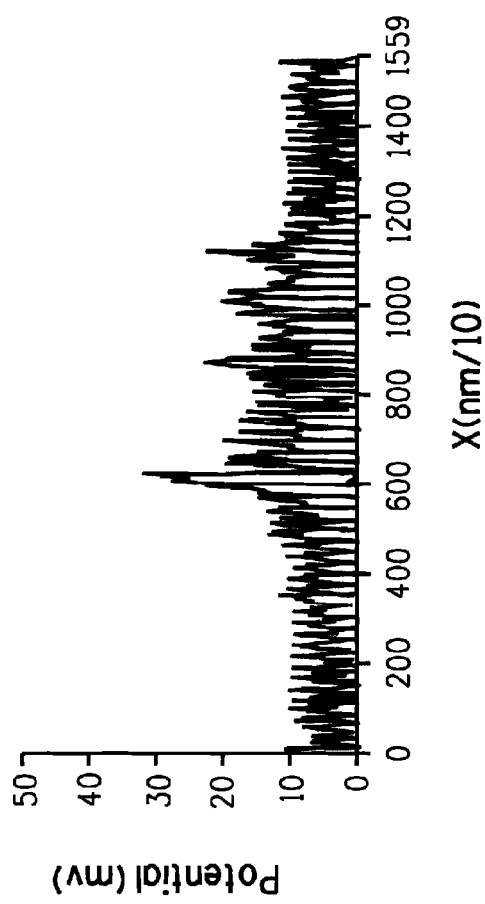
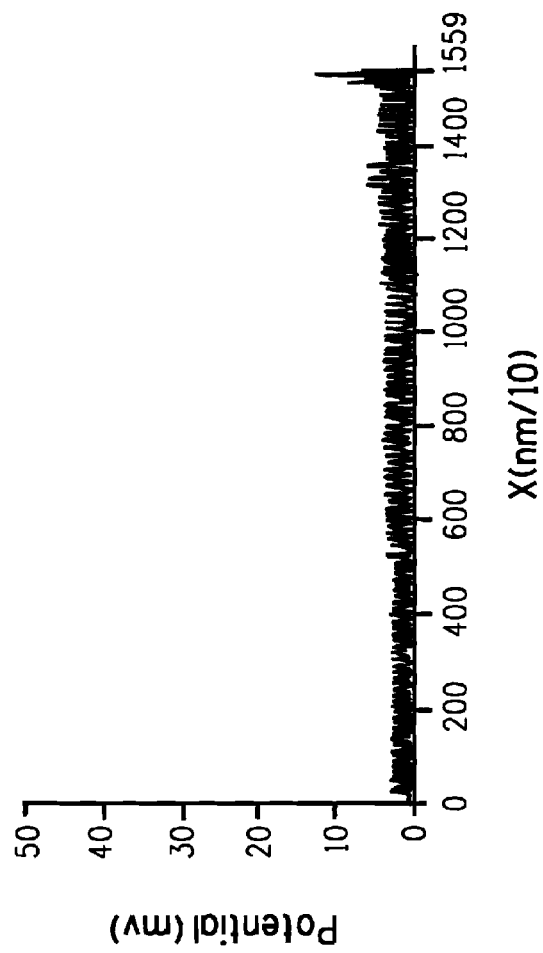
FIG. 13A
FIG. 13B

CONDUCTIVE COMPOSITIONS AND PROCESSES FOR USE IN THE MANUFACTURE OF SEMICONDUCTOR DEVICES

FIELD OF THE INVENTION

Embodiments of the invention relate to a silicon semiconductor device, and a conductive silver paste for use on the front side of a solar cell device.

TECHNICAL BACKGROUND OF THE INVENTION

A conventional solar cell structure with a p-type base has a negative electrode that is typically on the front-side or sun side of the cell and a positive electrode on the backside. It is well-known that radiation of an appropriate wavelength falling on a p-n junction of a semiconductor body serves as a source of external energy to generate hole-electron pairs in that body. Because of the potential difference existing at a p-n junction, holes and electrons move across the junction in opposite directions and thereby give rise to flow of an electric current that is capable of delivering power to an external circuit. Most solar cells are in the form of a silicon wafer that has been metalized, i.e., provided with metal contacts that are electrically conductive. Although various methods and compositions for forming solar cells exist, there is a need for compositions, structures, and devices which have improved electrical performance, and methods of making.

SUMMARY OF THE INVENTION

The present invention relates to a thick film conductive composition including: (a) electrically conductive silver; (b) one or more glass frit compositions, wherein at least one of the glass frit compositions comprises 4-26 wt % $SiO_2$, 6-52 wt % $Bi_2O_3$ and 5-29 wt % $PbF_2$, based on wt % of the total glass frit; dispersed in (c) organic vehicle. The thick film conductive composition may include one or more zinc-containing additives. The zinc-containing additive may include ZnO.

In an embodiment, the glass frit of the thick film conductive composition may include 18-26 wt % $SiO_2$, based on wt % of the total glass frit composition. The glass frit of the thick film conductive composition may include 20-52 wt % PbO, 0-1 wt % $Al_2O_3$, 2-7 wt % $TiO_2$, and 0-8 wt % $B_2O_3$, based on wt % of the total glass frit composition. The glass frit composition may include 0-1 wt % BaO, based on wt % of the total glass frit composition. The glass frit composition may not include BaO.

In a further embodiment, the thick film conductive composition may include 2-8 wt % zinc-containing additive, and 1-3 wt % glass frit, based on the weight of the total composition.

A further embodiment relates to an electrode formed from a thick film conductive composition including: (a) electrically conductive silver; (b) one or more glass frit compositions, wherein at least one of the glass frits includes Fluorine; dispersed in (c) organic vehicle; wherein the composition has been processed to remove said organic vehicle and sinter said glass frit and silver powder. In an embodiment, the composition may include a zinc-containing additive. The glass frit composition may include $SiO_2$. The glass frit composition may include 5-36 wt % $SiO_2$, 6-52 wt % $Bi_2O_3$ and 5-29 wt % $PbF_2$, based on the weight % of the total glass composition.

An embodiment relates to a structure including: (a) a composition including: electrically conductive silver; one or more glass frit compositions, wherein at least one of the glass frits includes Fluorine; dispersed in organic vehicle; (b) an insulating film; and (c) a semiconductor substrate. In an embodiment, the composition may include a zinc-containing additive.

A further embodiment relates to a semiconductor device including (a) an electrode, wherein the electrode includes silver and Fluorine; (b) an insulating film; and (c) a semiconductor substrate. The electrode may also include a zinc-containing additive. The semiconductor device may be a solar cell.

An embodiment relates to a method of manufacturing a semiconductor device including: (a) providing a junction-bearing semiconductor substrate; (b) applying an insulating film to the semiconductor substrate; (c) applying a thick film composition to the insulating film, wherein the thick film composition includes: electrically conductive silver; one or more glass frit compositions, wherein at least one of the glass frits includes Fluorine; dispersed in organic vehicle; and (d) firing the device.

A further embodiment relates to a thick film conductive composition including: (a) electrically conductive silver; (b) one or more glass frits, wherein at least one of the glass frits includes 5-15 wt % $SiO_2$, 20-29 wt % $PbF_2$, and 15-25% ZnO, based on the weight % of the total glass frit composition; dispersed in (c) organic vehicle. The glass frit composition may include 17-64 wt % PbO, 0-9 wt % $Al_2O_3$, and 0.1-2.5 wt % $ZrO_2$, based on the weight % of the total glass frit composition.

An embodiment relates to a thick film conductive composition including: (a) electrically conductive silver; (b) one or more glass frits, wherein at least one of the glass frits includes 5-36 wt % $SiO_2$ and 0.50-5.3 wt % Fluorine, based on the weight % of the total glass frit composition; dispersed in (c) organic vehicle. The composition may also include one or more zinc-containing additives.

A further embodiment relates to a thick film conductive composition including: (a) electrically conductive silver; (b) one or more glass frits, wherein at least one of the glass frits includes 4-26 wt % $SiO_2$, 0-1 wt % BaO and 5-29 wt % $PbF_2$, based on wt % of the total glass frit composition; dispersed in (c) organic vehicle. The composition may also include one or more zinc-containing additives.

Figure 1A:
FIG. 1 is a process flow diagram illustrating the fabrication of a semiconductor device.

Reference numerals shown in FIG. 1 are explained below.

10: p-type silicon substrate
20: n-type diffusion layer
30: silicon nitride film, titanium oxide film, or silicon oxide film
40: p+ layer (back surface field, BSF)
60: aluminum paste formed on backside
61: aluminum back electrode (obtained by firing back side aluminum paste)
70: silver or silver/aluminum paste formed on backside
71: silver or silver/aluminum back electrode (obtained by firing back side silver paste)
500: silver paste formed on front side according to the invention
501: silver front electrode according to the invention (formed by firing front side silver paste)

Figure 2:
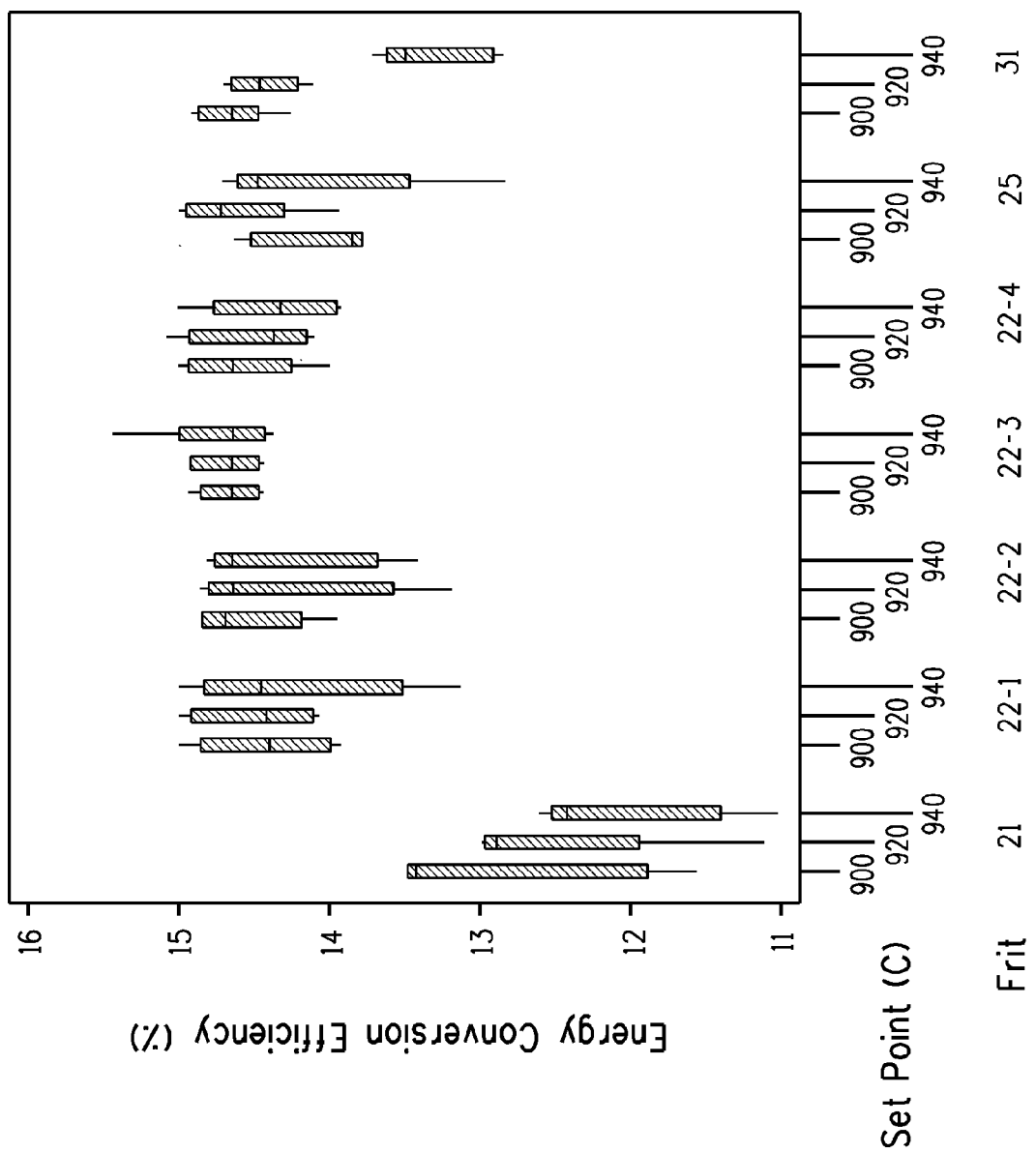

FIG. 2 describes the effect of glass composition on cell performance.

Figure 3:
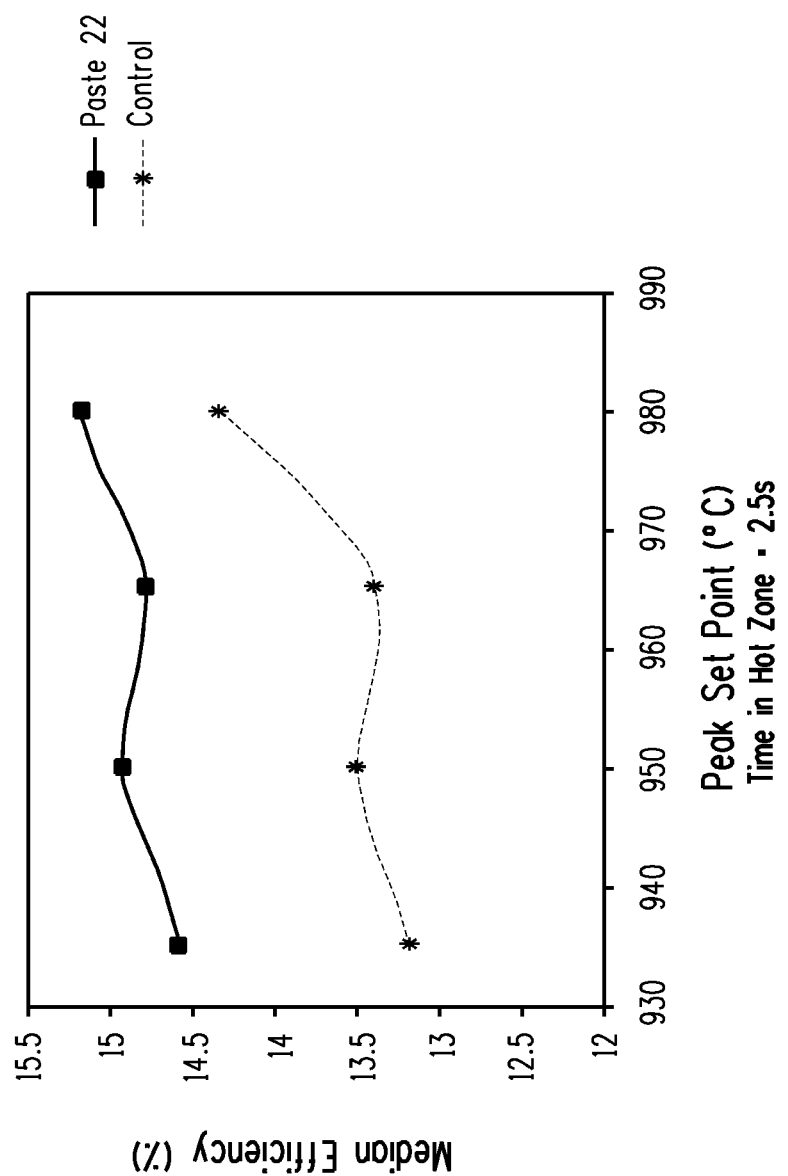

FIG. 3 describes cell efficiency versus furnace set temperature.

Figure 4:
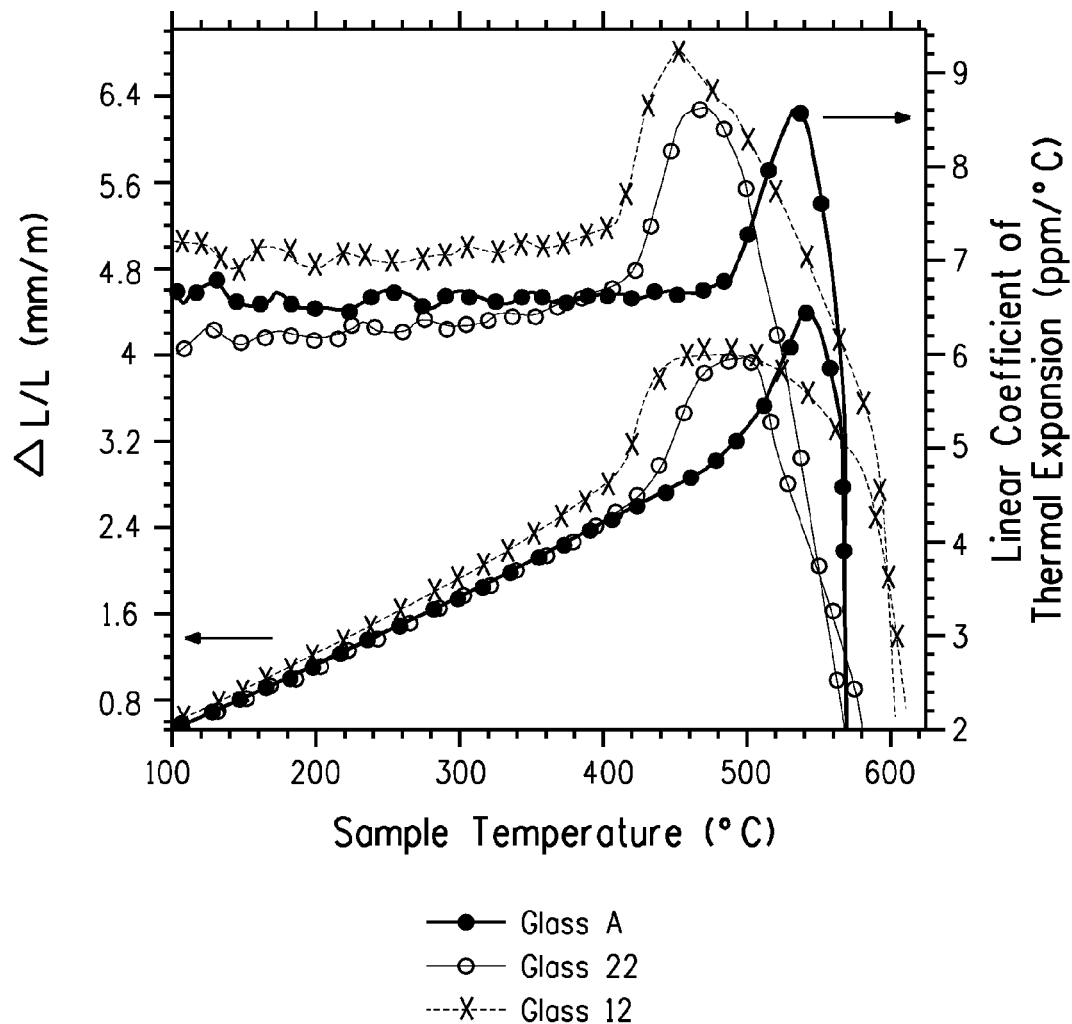

FIG. 4 describes horizontal dilatometry from fused bars of frit.

Figure 5:
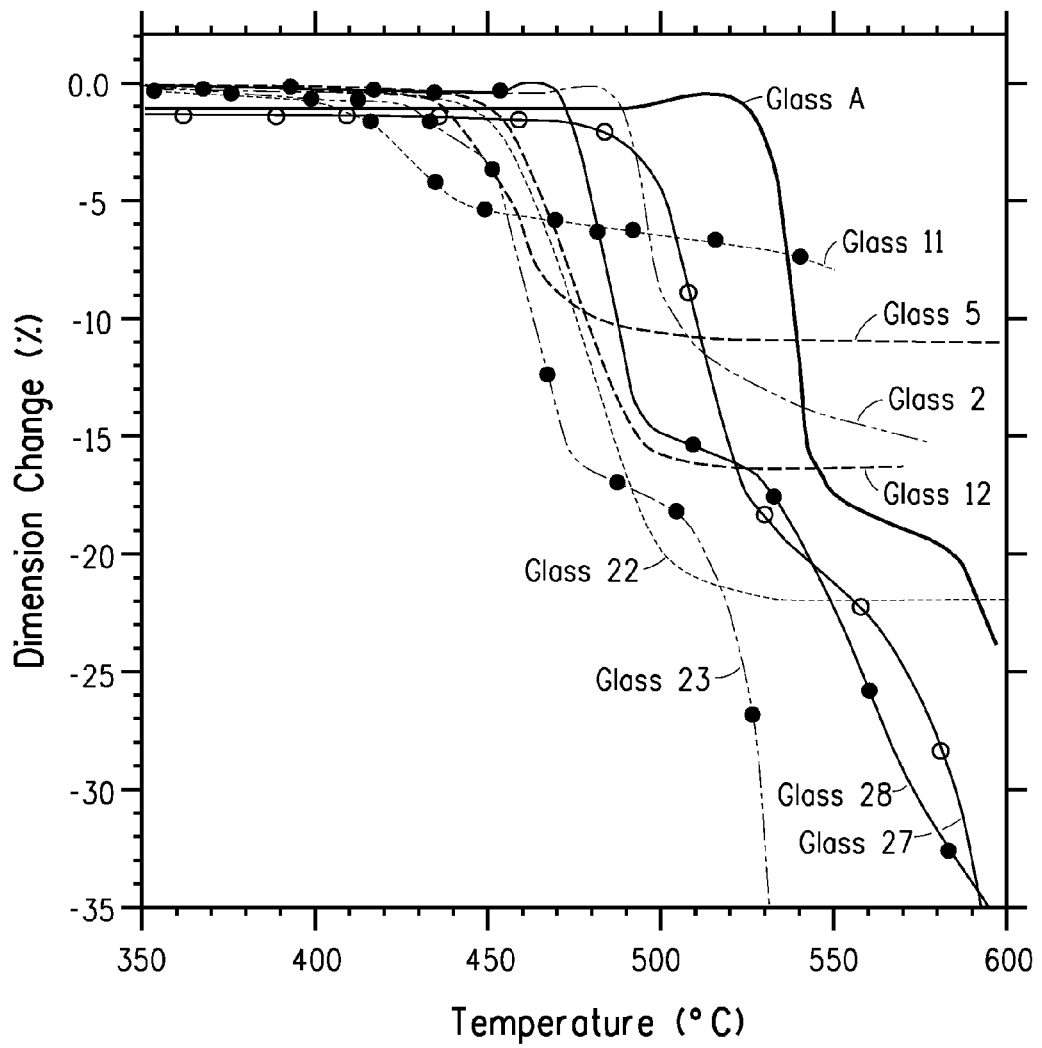

FIG. 5 describes Thermal-Mechanical Analyzer data for pressed frit pellets.

Figure 6:
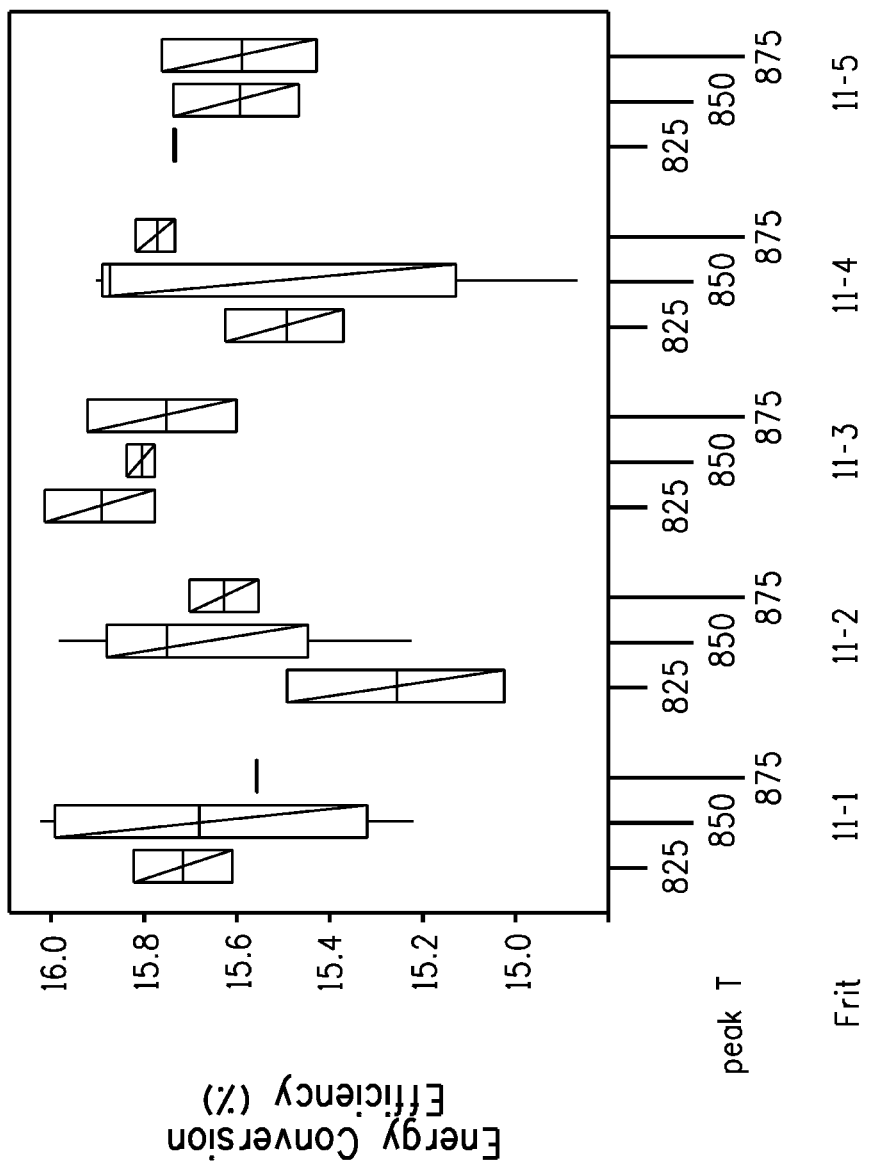

FIG. 6 describes photovoltaic cell efficiency for conductor pastes.

Figure 7:
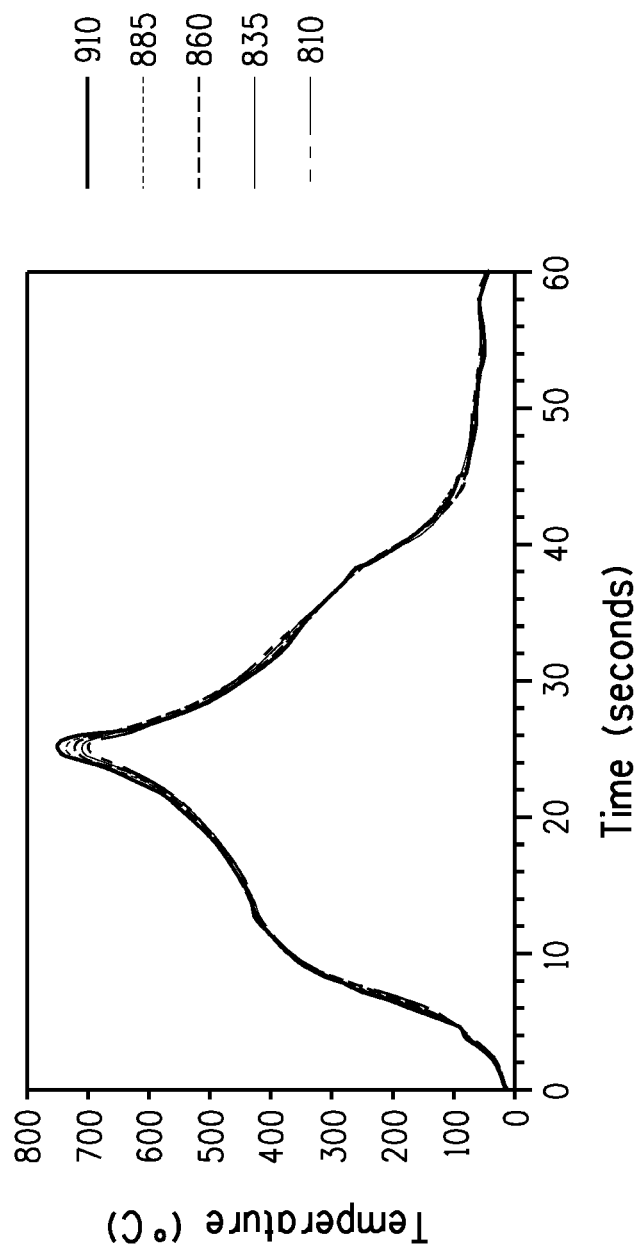

FIG. 7 describes temperature-time Profiles for the Example on page 22.

Figure 8:
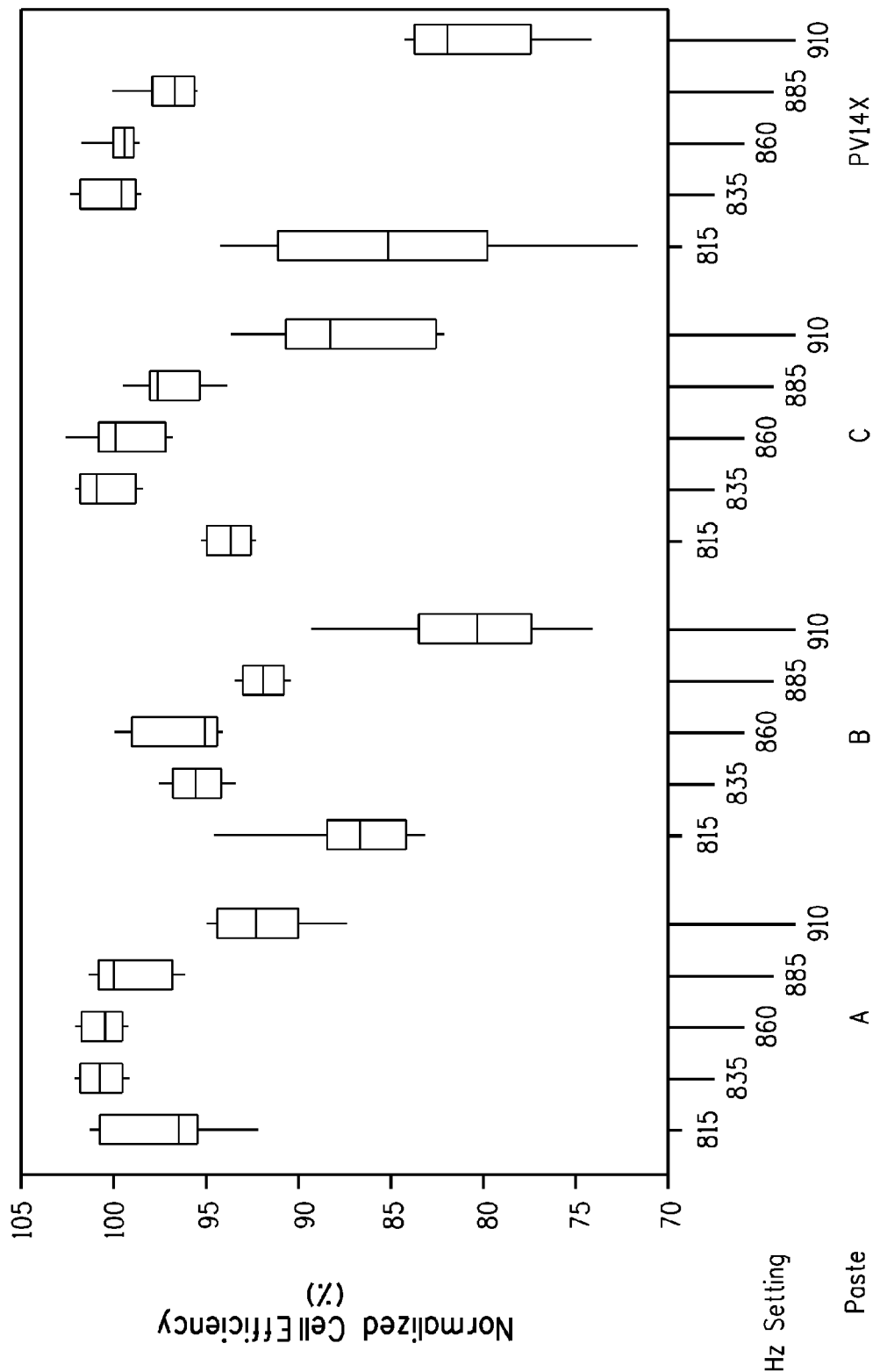

FIG. 8 describes normalized efficiency across the firing temperature range.

Figure 9:
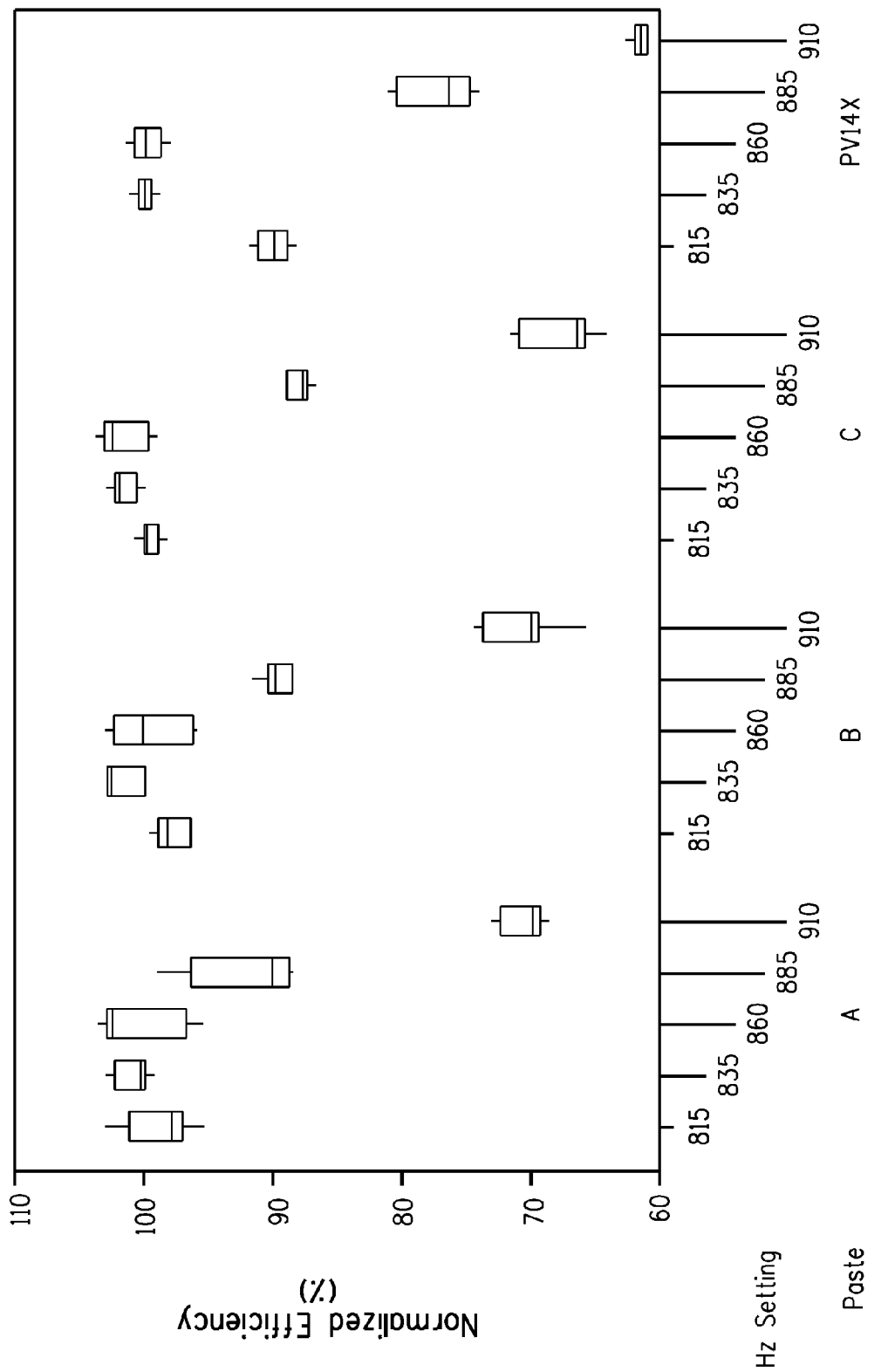

FIG. 9 describes response of paste B on monocrystalline Si.

Figure 10:
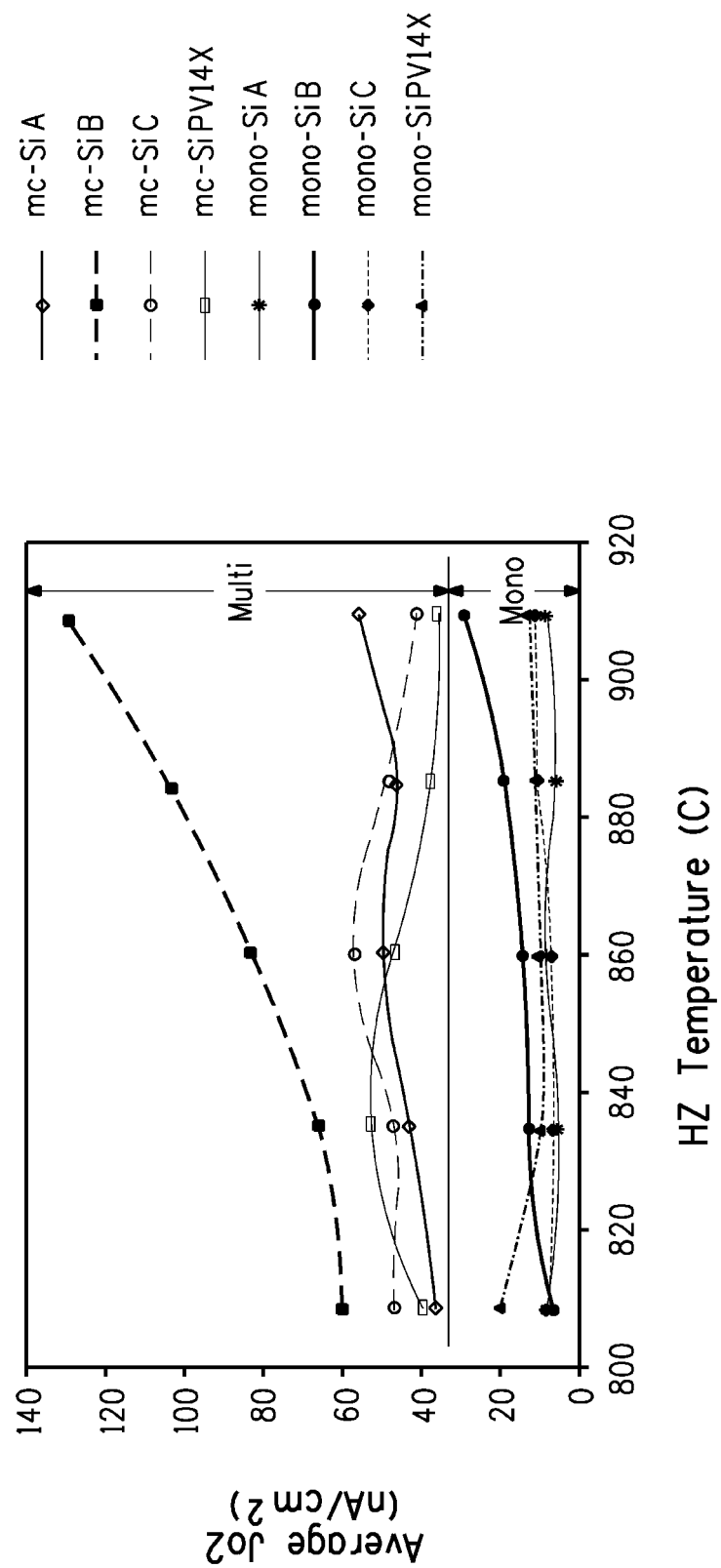

FIG. 10 describes pastes on different wafers

Figure 11:
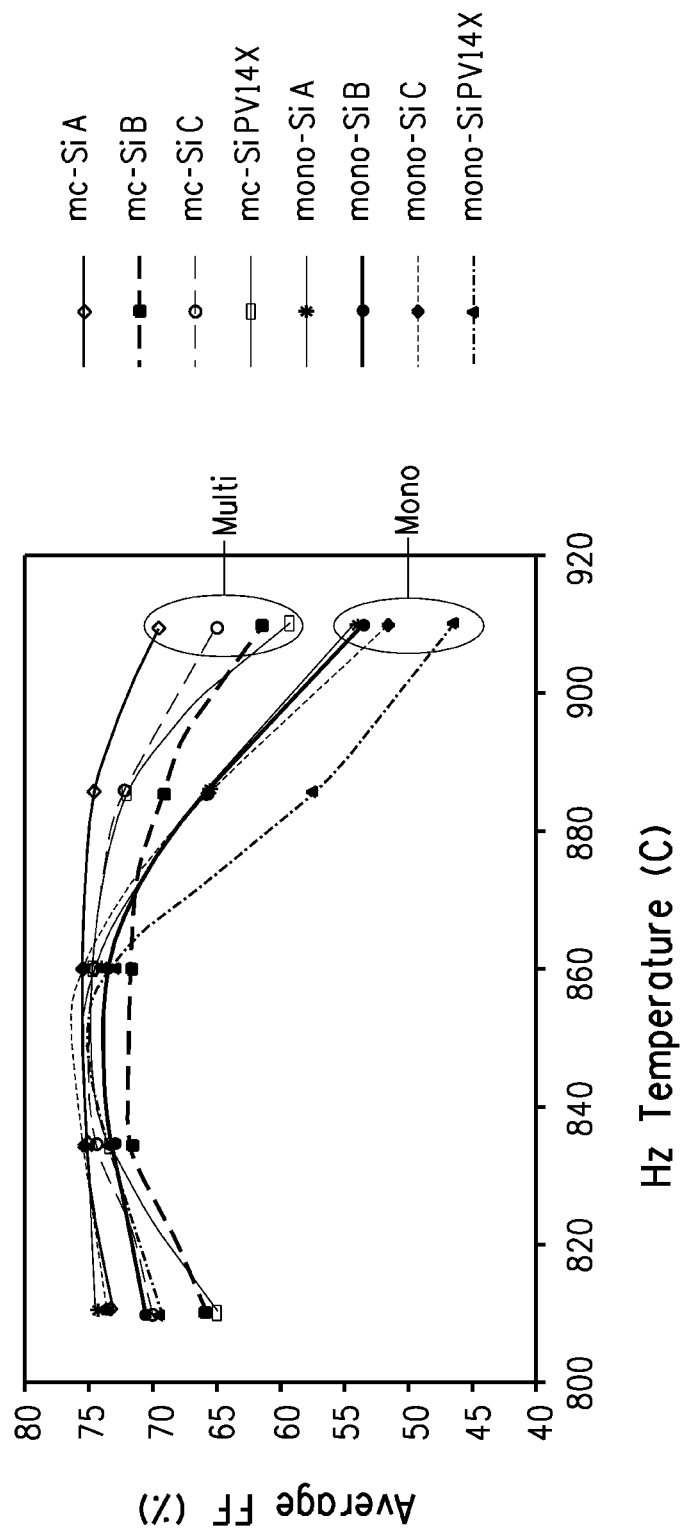

FIG. 11 describes fill factors for pastes on different wafers.

Figure 12:
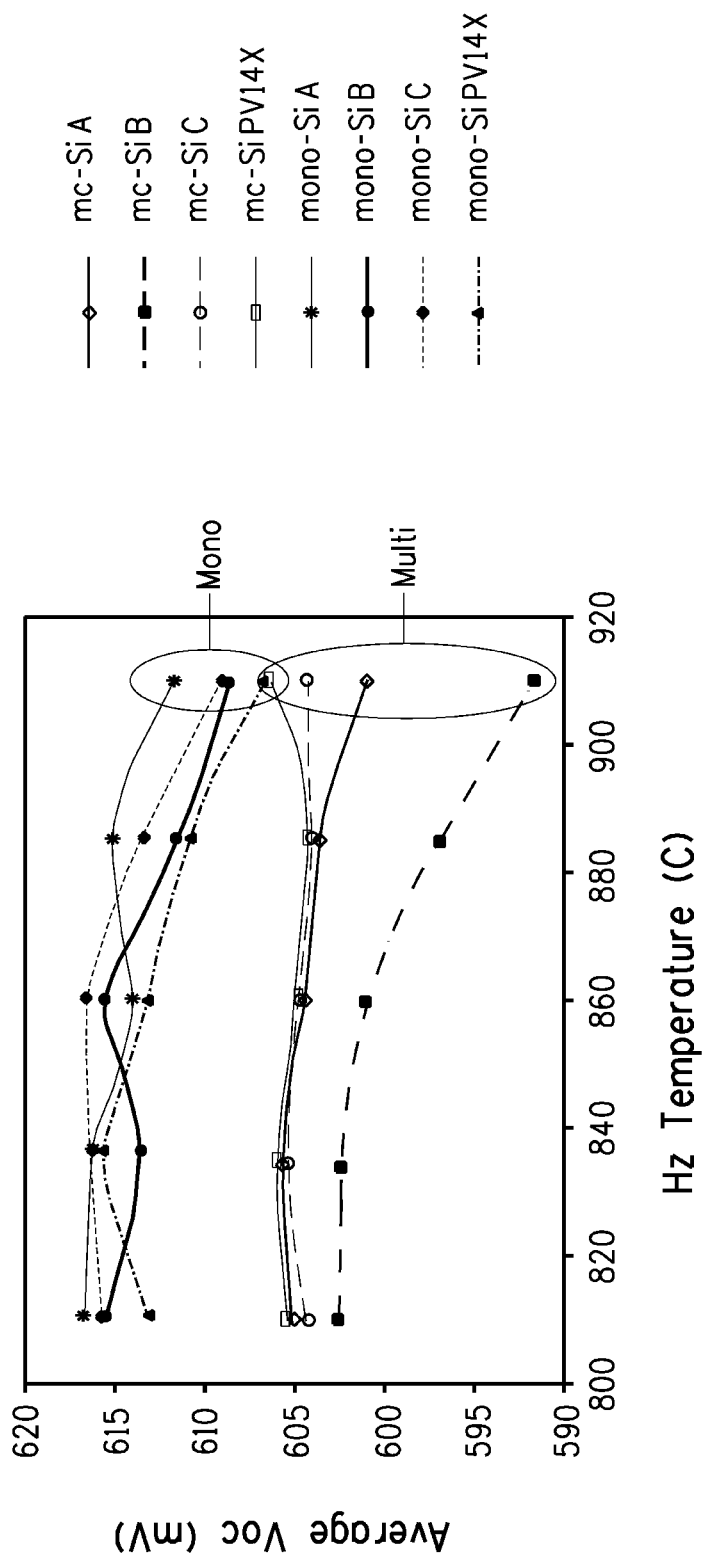

FIG. 12 describes average "Vos" of pastes on different wafers.

FIGS. 13, 14, 15 and 16 are contact resistance maps

Figure 17:
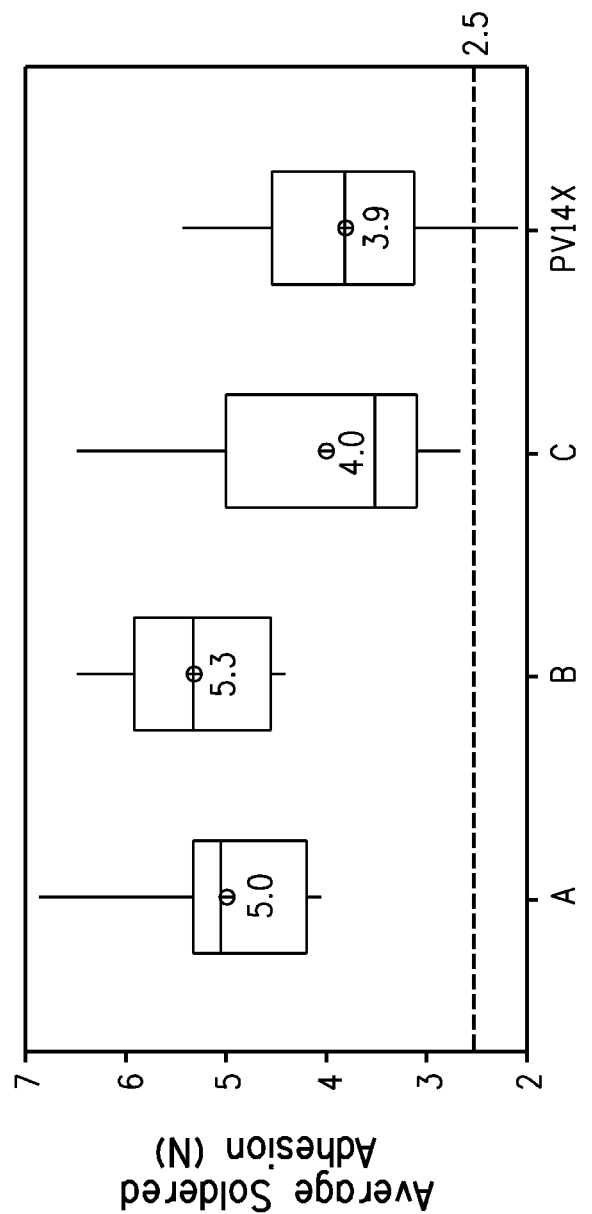

FIG. 17 graphs solder adhesion.

Figure 18A:
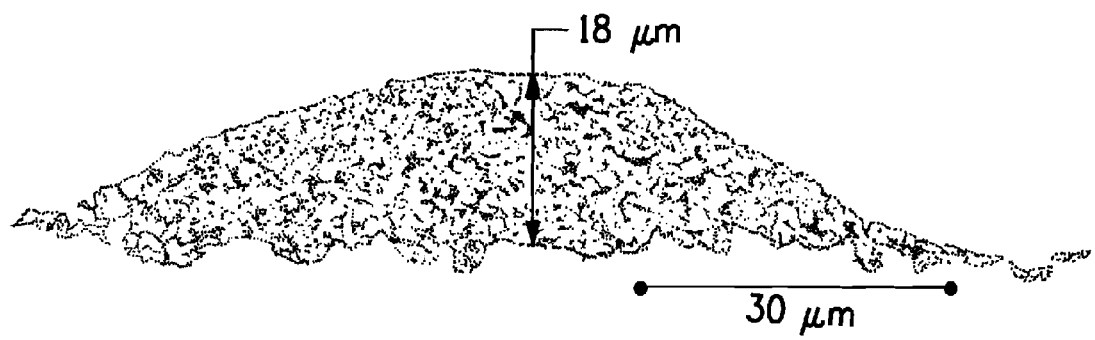
Figure 18B:
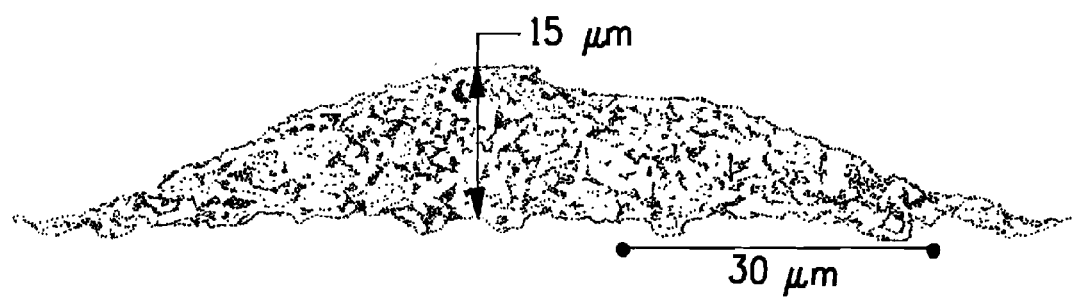

FIG. 18 are photomicrographs comparing pastes.

DETAILED DESCRIPTION OF THE INVENTION

The main components of the thick film conductor composition(s) are electrically functional silver powders, zinc-containing additive(s), and glass frit dispersed in an organic vehicle. Additional additives may include metals, metal oxides or any compounds that can generate these metal oxides during firing. The components are discussed herein below.

A. Inorganic Components

The inorganic components of the present invention comprise (1) electrically functional silver powders; (2) Zn-containing additive(s); (3) glass frit; and optionally (4) additional metal/metal oxide additive selected from (a) a metal wherein said metal is selected from Zn, Bi, Pb, Gd, Ce, Zr, Ti, Mn, Sn, Ru, Co, Fe, Cu and Cr; (b) a metal oxide of one or more of the metals selected from Zn, Bi, Pb, Gd, Ce, Zr, Ti, Mn, Sn, Ru, Co, Fe, Cu and Cr; (c) any compounds that can generate the metal oxides of (b) upon firing; and (d) mixtures thereof.

B. Electrically Functional Silver Powders

The thick film composition may include a functional phase that imparts appropriate electrically functional properties to the composition. The functional phase may include electrically functional powders dispersed in an organic vehicle that acts as a carrier for the functional phase that forms the composition. The composition is fired to burn out the organic phase, activate the inorganic binder phase and to impart the electrically functional properties.

The functional phase of the composition may be coated or uncoated silver particles which are electrically conductive. In an embodiment in which the silver particles are coated, they are at least partially coated with a surfactant. The surfactant may be selected from, but is not limited to, stearic acid, palmitic acid, a salt of stearate, a salt of palmitate and mixtures thereof. Other surfactants may be utilized including lauric acid, palmitic acid, oleic acid, stearic acid, capric acid, myristic acid and linolic acid. The counter-ion can be, but is not limited to, hydrogen, phosphate, ammonium, sodium, potassium and mixtures thereof.

The particle size of the silver is not subject to any particular limitation. In an embodiment, the average particle size of the silver may be less than 10 microns; in a further embodiment, the average particle size of the silver may be less than 5 microns. In an embodiment, the silver powder accounts for 70 to 85 wt % of the total paste composition; in an aspect of this embodiment, the silver powder may be 85 to 99 wt % of the solids in the composition (i.e., excluding the organic vehicle).

C. Zn-Containing Additive(s)

The Zn-containing additive of the present invention may be selected from (a) Zn, (b) metal oxides of Zn, (c) any compounds that can generate metal oxides of Zn upon firing, and (d) mixtures thereof.

In one embodiment, the Zn-containing additive is ZnO, wherein the ZnO has an average particle size in the range of 10 nanometers to 10 microns. In a further embodiment, the ZnO has an average particle size of 40 nanometers to 5 microns. In still a further embodiment, the ZnO has an average particle size of 60 nanometers to 3 microns.

In a further embodiment, the Zn-containing additive has an average particle size of less than 0.1 µm. In particular the Zn-containing additive has an average particle size in the range of 7 nanometers to less than 100 nanometers. In a further embodiment, the Zn-containing additive has an average particle size in the range of 7 nm to 80 nm; 7 nm to 70 nm; 7 to 60 nm; or 7 to 50 nm, for example.

In an embodiment, the ZnO may be present in the composition in the range of 2 to 10 weight percent, based on the total composition. In one embodiment, the ZnO is present in the range of 2 to 8 weight percent; 3 to 8 weight percent; 4 to 8 weight percent, based on the total composition. In still a further embodiment, the ZnO is present in the range of 5 to 7 weight percent total composition.

In a further embodiment the Zn-containing additive (for example Zn, Zn resinate, etc.) may be present in the total thick film composition in the range of 2 to 16 weight percent. In a further embodiment the Zn-containing additive may be present in the range of 4 to 12 weight percent total composition.

D. Glass Frit

Exemplary glass frit compositions (glass compositions) of the present invention are listed in Table I below. It is important to note that the compositions listed in Table I are not limiting, as it is expected that one skilled in glass chemistry could make minor substitutions of additional ingredients and not substantially change the desired properties of the glass composition of this invention. In this way, substitutions of glass formers such as $P_2O_5$ 0-5, $GeO_2$ 0-5, $V_2O_5$ 0-5 in weight % maybe used either individually or in combination to achieve similar performance. It is also possible to substitute one or more intermediate oxides, such as $TiO_2$, $Ta_2O_5$, $Nb_2O_5$, $ZrO_2$, $CeO_2$, $SnO_2$ for other intermediate oxides (i.e., $Al_2O_3$, $CeO_2$, $SnO_2$) present in a glass composition of this invention.

It is observed from the data that, inclusion of $PbF_2$ as a glass constituent constitutes a key aspect of the invention. Stated in another way, the addition of fluorine as an anionic substitution for oxygen in a Pb containing glass chemistry imparts a particular advantage in PV cell performance, and can be added by a number of raw material fluoride salts as can be seen by one skilled in the art of glass making. The specific advantage provided by the fluorine substitution is the progressive development of immiscibility in the glass as increasing amounts of fluorine are introduced to the glass composition. Two liquid phases may be created at elevated temperature in many cases characterized by a siliceous more refractory glass phase and a soft glass phase characterized as generally containing lead oxide, boric oxide and fluoride salts. A secondary advantage is the progressive shift to a lower temperature onset of sintering as evidenced by TMA measurements of the glass as fluorine is substituted for oxygen. This development of glass immiscibility can advantageously change the chemical activity of the molten glass in a dynamic fashion with time from its initial fusion and reaction conditions, necessary to remove the insulating layer on device structures, to a less active state while providing for the adhesion of metallic conductor materials formulated with the glass to affect a bond adhesion and electrical contact to the semiconductor substrate. The soft glass phase tends to be encapsulated by the siliceous glass phase as the soft glass coalesces from small droplets to larger droplets resulting in potential property changes in the glass that have specific advantages to the performance properties of a solar cell made with such materials. The thermal process latitude of the cell efficiency and other performance properties may be extended over a broader temperature range than of materials made with non-immiscible glass or non-crystallizable glass used in the conductor paste formulation on a suitable semiconductor substrate. Alternative metal fluoride salts include, but are not limited to, $PbF_2$, $BiF_3$, $AlF_3$, NaF, LiF, and/or $ZnF_2$.

The glass compositions in weight percent total glass composition are shown in Table I. Glass compositions found in the examples comprise the following oxide constituents in the compositional range of: $SiO_2$ 0-36, $Al_2O_3$ 0-9, $B_2O_3$ 0-19, PbO 16-84, CuO 0-4, ZnO 0-24, $Bi_2O_3$ 0-52, $ZrO_2$ 0-8, $TiO_2$ 0-20, $P_2O_5$ 0-5, $PbF_2$ 3-34 in weight percent total glass composition. This range may also be expressed in terms of free fluorine content as follows: $SiO_2$ 0-36, $Al_2O_3$ 0-9, $B_2O_3$ 0-19, PbO 30-88, CuO 0-4, ZnO 0-24, $Bi_2O_3$ 0-52, $ZrO_2$ 0-8, $TiO_2$ 0-20, $P_2O_5$ 0-5, Fluorine 0.50-5.3 in weight percent total glass composition. In another embodiment consisting of those glasses containing bismuth oxide, the glass frit may comprise, based on weight percent of total glass composition: $SiO_2$ 4-26, $Al_2O_3$ 0-1, $B_2O_3$ 0-8, PbO 20-52, ZnO 0-4, $Bi_2O_3$ 6-52, $TiO_2$ 2-7, $PbF_2$ 5-29, $Na_2O$ 0-1, $Li_2O$ 0-1. In another embodiment consisting of those glasses containing zinc oxide, the glass frit may comprise, based upon weight percent of total glass composition: $SiO_2$ 5-36, $Al_2O_3$ 0-9, $B_2O_3$ 0-19, PbO 17-64, $Bi_2O_3$ 0-39, $TiO_2$ 0-6, $P_2O_5$ 0-5, $PbF_2$ 6-29 in weight percent total glass composition; in an aspect of this embodiment, the glass frit may include 5-15 wt % $SiO_2$, based on the weight percent of the total glass composition; in an aspect of this embodiment, the glass frit may include 20-29 wt % $PbF_2$. In an embodiment, the zinc oxide-containing glass frit may include 15-25% ZnO; in an aspect of this embodiment, the zinc-oxide containing glass frit may include 0-3 wt % $ZrO_2$; in a further aspect, 0.1-2.5 wt % $ZrO_2$, based on the weight % of the total glass frit composition. An embodiment consisting of those glasses containing copper oxide and or alkali modifiers, the glass frit may comprise, based on weight percent of total glass composition: $SiO_2$ 25-35, $Al_2O_3$ 0-4, $B_2O_3$ 3-19, PbO 17-52, ZnO 0-12, $Bi_2O_3$ 0-7, $TiO_2$ 0-5, $PbF_2$ 7-22, CuO 0-3, $Na_2O$ 0-4, $Li_2O$ 0-1. The fluoride used in the composition may be sourced from compounds of the available composition such as $PbF_2$, $BiF_3$, $AlF_3$ or other such compounds with appropriate calculations to maintain the same target composition. An example of this calculation equivalency is shown for Glass ID #22 as: $SiO_2$ 22.08, $Al_2O_3$ 0.38, PbO 56.44, $B_2O_3$ 7.49, $TiO_2$ 5.86, $Bi_2O_3$ 6.79, F 1.66 weight % where the fluorine is expressed as elemental fluorine and associated oxides. One skilled in the art would be expected to make these conversion calculations. Table VII outlines the same compositions of Table I in a way to show the amount of F in the composition verses in terms of a specific metal fluoride salt. In an embodiment, glass compositions may have a total of PbO, $Bi_2O_3$ and $PbF_2$ between 40-90% in wt % of the glass composition. The glass composition can be generally described by the following in weight % of the glass composition: $SiO_2$ 1-36, PbO 17-83, $B_2O_3$ 1.5-19, $PbF_2$ 4-29 and optional constituents include: $Al_2O_3$ 0-8, $ZrO_2$ 0-8, ZnO 0-12, CuO 0-4, Bi2O3 0-35, and $TiO_2$ 0-7. It is also possible to describe the compositional range as a $SiO_2$, PbO, F, and $B_2O_3$ with optional additions of $Al_2O_3$, $ZrO_2$, ZnO, CuO, $Bi_2O_3$, $TiO_2$, and compound fluorides as source compound for the supply of fluorine to the composition.

In another embodiment of this invention the glass frit can be generally described in weight % in terms of free fluorine as described in Table VI as: $SiO_2$ 0-36, PbO 30-90, $B_2O_3$ 0-19, ZnO 0-24, CuO 0-3, $Bi_2O_3$ 0-55, $P_2O_5$ 0-, alkali oxides 0-5, and the total sum of $Al_2O_3$+$TiO_2$+$ZrO_2$ 0-25, and fluorine 0.5-6 wt % where alkali oxides include but are not limited to $Li_2O$, $Na_2O$, $K_2O$, or $Cs_2O$ and fluorine can be supplied as compound fluorides. In another embodiment of this invention glass frit compositions include a intermediate silica content with small additions of fluorine and can generally be described comprising in weight % as: SiO2 10-30, PbO 40-60, $B_2O_3$ 0-10, $Bi_2O_3$ 3-10, and the total sum of $Al_2O_3$+$TiO_2$+$ZrO_2$ 0.5-10, and optional constituents include but are not limited to ZnO, CuO, $P_2O_5$, CuO, or alkali oxides. One skilled in the art will recognize that fluorine is often added to two distinct types of silicate glasses: 1) in very hard glass with high silica content fluorine is added to lower the melting temperature to a regime more accessible by common glass melting equipment or 2) in low temperature, low silica content glasses common used in sealing application where fluorine is added to lower the softening point to below 300° C. The invention described here is the use of fluorine in intermediate silica content glasses to realize the phase immiscibility during heating and manifests as an arrest of glass flow within the temperature range of 475° C. to 600° C. as seen in FIG. 5.

In an embodiment, the average particle size of the glass frit (glass composition) may be in the range of 0.5-1.5 µm; in a further embodiment, the average particle size may be in the range of 0.8-1.2 µm. In an embodiment, the amount of glass frit in the total composition may be in the range of 0.5 to 4 wt. % of the total composition. In one embodiment, the glass composition may be present in the amount of 1 to 3 weight % of the total composition. In a further embodiment, the glass composition may be present in the range of 1.5 to 2.5 weight % of the total composition.

A high amount of BaO in the glass frit composition may alter the chemical activity of the conductive composition. Additionally, a high amount of BaO may increase the onset of sintering of the glass frit. This property can be measured by thermal characterization done by DTA, differential thermal analysis or TMA, thermo-mechanical analysis. In an embodiment, the glass frit composition does not include BaO. In a further embodiment, the composition may include 0-4 wt % BaO; in a further aspect, the composition may include 0.1-4 wt % BaO; in a further aspect, the composition may include 0-2.5 wt % BaO; and in an additional aspect, the composition may include 0-1 wt % BaO, based on the wt % of the total glass frit composition.

An exemplary method for producing the glass frits described herein is by conventional glass making techniques. Ingredients are weighed then mixed in the desired proportions and heated in a furnace to form a melt in platinum alloy crucibles. As well known in the art, heating is conducted to a peak temperature (800-1400° C.) and for a time such that the melt becomes entirely liquid and homogeneous. The molten glass is then quenched between counter rotating stainless steel rollers to form a 10-15 mil thick platelet of glass. The resulting glass platelet was then milled to form a powder with its 50% volume distribution set between to a desired target (e.g. 0.8-1.5 micron). One skilled the art of producing glass frit may employ alternative synthesis techniques such as but not limited to water quenching, sol-gel, spray pyrolysis, or others appropriate for making powder forms of glass.

In one embodiment of this invention, a thick film paste (also termed thick film composition or thick film conductive composition herein) may include a zinc containing additive combined with a glass frit which is fired in a furnace. During this firing process the zinc containing additive may combine to some degree with the frit when the temperature is above Tg. In a further embodiment, this combination may be favorable to the formation of a crystalline phase. In a still further embodiment, this crystalline phase may include a zinc silicate such as willemite which results from the combination of the zinc additive and the ZnO and/or $SiO_2$ of the glass frit composition. A consequence of precipitating a crystal phase in the viscous glass is the depletion of these constituents from the molten glass. In yet another further embodiment, if the crystalline phase includes a glass former constituent, for example $SiO_2$, then the remnant glass is depleted in silica and may have a lower Tg, viscosity, and be more corrosive to underlying substrate or other local phases.

E. Additional Metal/Metal Oxide Additives

The additional metal/metal oxide additives of the present invention may be selected from (a) a metal wherein said metal is selected from Zn, Bi, Pb, Gd, Ce, Zr, Ti, Mn, Sn, Ru, Co, Fe, Cu, Mg and Cr; (b) a metal oxide of one or more of the metals selected from Zn, Bi, Pb, Gd, Ce, Zr, Ti, Mn, Sn, Ru, Co, Fe, Cu, Mg and Cr; (c) any compounds that can generate the metal oxides of (b) upon firing; and (d) mixtures thereof.

The particle size of the additional metal/metal oxide additives is not subject to any particular limitation. In an embodiment, the average particle size of additional metal/metal oxide additives may be less than 10 microns; in a further embodiment, the average particle size may be less than 5 microns. In one embodiment, the particle size of the metal/metal oxide additive may be in the range of 7 nanometers (nm) to 125 nm.

In an embodiment, the range of the metal/metal oxide additives and ZnO in the total composition may be in the range of 0 to 8 weight percent of the total composition. In one embodiment, the metal/metal oxide additives may be present in an amount of 4 to 8 weight percent of the total composition. In an embodiment in which metal/metal oxide additives and ZnO are both present in the composition, the metal/metal oxide additives may be present in the range of 1 to 5 weight percent of the total composition and the ZnO may be present in the range of 2 to 5 weight percent of the total composition.

F. Organic Vehicle

The inorganic components are typically mixed with an organic vehicle by mechanical mixing to form viscous compositions called "pastes", having suitable consistency and rheology for printing. The organic vehicle may include a wide variety of inert viscous materials. In an embodiment, the organic vehicle may be one in which the inorganic components are dispersible with an adequate degree of stability. In an embodiment, the rheological properties of the vehicle may lend good application properties to the composition, including: stable dispersion of solids, appropriate viscosity and thixotropy for screen printing, appropriate wet ability of the substrate and the paste solids, a good drying rate, and good firing properties.

In an embodiment, the organic vehicle used in the thick film composition of the present invention may be a non-aqueous inert liquid. The use of various organic vehicles, which may or may not contain thickeners, stabilizers and/or other common additives, is contemplated. The organic vehicle may be a solution of polymer(s) in solvent(s). In an embodiment, the organic vehicle may also include one or more components, such as surfactants. In an embodiment, the polymer may be ethyl cellulose. Other exemplary polymers include ethylhydroxyethyl cellulose, wood rosin, mixtures of ethyl cellulose and phenolic resins, polymethacrylates of lower alcohols, and monobutyl ether of ethylene glycol monoacetate, or mixtures thereof. In an embodiment, the solvents useful in thick film compositions described herein include ester alcohols and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In addition, the organic vehicle may include volatile liquids for promoting rapid hardening after application on the substrate.

In an embodiment, the polymer may be present in the organic vehicle in the range of 8 wt. % to 11 wt. % of the total composition, for example. The thick film silver composition of the present invention may be adjusted to a predetermined, screen-printable viscosity with the organic vehicle.

In an embodiment, the ratio of organic vehicle in the thick film composition to the inorganic components in the dispersion may be dependent on the method of applying the paste and the kind of organic vehicle used, as determined by one of skill in the art. In an embodiment, the dispersion may include 70-95 wt % of inorganic components and 5-30 wt % of organic vehicle in order to obtain good wetting.

Description of Method of Manufacturing a Semiconductor Device

Accordingly, the invention provides novel composition(s) that may be utilized in the manufacture of a semiconductor device. The semiconductor device may be manufactured by the following method from a structural element including a junction-bearing semiconductor substrate and an insulating film formed on a main surface thereof. In an embodiment, the insulating film may be selected from the group consisting of: silicon nitride, $SiN_x$:H, silicon oxide, titanium oxide, silicon oxide/titanium oxide film, titania, and mixtures thereof. The method of manufacture of a semiconductor device includes the steps of applying (for example, by coating and printing) onto the insulating film, in a predetermined shape and at a predetermined position, the thick film conductive composition of the present invention having the ability to penetrate the insulating film, then firing so that the conductive thick film composition melts and passes through the insulating film, effecting electrical contact with the silicon substrate. In an embodiment, the thick film conductive composition may include silver powder, Zn-containing additive, a glass or glass powder mixture having a softening point of 300 to 600° C., dispersed in an organic vehicle and optionally, additional metal/metal oxide additive(s).

In an embodiment, the composition may include glass powder of less than 5% by weight of the total composition and a Zn-containing additive combined with optional additional metal/metal oxide additive content of no more than 6% by weight of the total composition. The invention also provides a semiconductor device manufactured from the method.

The invention may also be characterized by the use of a silicon nitride film or silicon oxide film as the insulating film. In an embodiment. the silicon nitride film may be formed by a plasma chemical vapor deposition (CVD), thermal CVD, or physical vapor deposition (PVD) process. In an embodiment, the silicon oxide film may be formed by thermal oxidation, thermal CFD or plasma CFD.

The method of manufacture of the semiconductor device may also be characterized by manufacturing a semiconductor device from a structural element including a junction-bearing semiconductor substrate and an insulating film formed on one main surface thereof, wherein the insulating layer may be selected from the group consisting of: silicon nitride, $SiN_x$:H, silicon oxide, titanium oxide, silicon oxide/titanium oxide film, titania, and mixtures thereof, which method includes the steps of forming on the insulating film, in a predetermined shape and at a predetermined position, a metal paste material having the ability to react and penetrate the insulating film, forming electrical contact with the silicon substrate. In an embodiment, the titanium oxide film may be formed by coating a titanium-containing organic liquid material onto the semiconductor substrate and firing, or by a thermal CVD. The silicon nitride film may be formed by PECVD (plasma enhanced chemical vapor deposition). The invention also provides a semiconductor device manufactured from this method.

The electrode formed from the conductive thick film composition(s) of the present invention may be fired in an atmosphere that may include a mixed gas of oxygen and nitrogen. In an embodiment, this firing process removes the organic vehicle and sinters the glass frit with the Ag powder in the conductive thick film composition. In an embodiment, the electrode includes electrically conductive silver; one or more glass frit compositions, wherein at least one of the glass frits includes fluorine; dispersed in organic vehicle; wherein the composition has been processed to remove said organic vehicle and sinter said glass frit and silver powder. In an embodiment, the semiconductor substrate may be single-crystal or multi-crystalline silicon.

FIG. 1(a) shows a step in which a substrate of single-crystal silicon or of multi-crystalline silicon is provided, with a textured surface which reduces light reflection. In the case of solar cells, substrates are often used as sliced from ingots which have been formed from pulling or casting processes. Substrate surface damage caused by tools such as a wire saw used for slicing and contamination from the wafer slicing step may be removed by etching away about 10 to 20 μm of the substrate surface using an aqueous alkali solution such as aqueous potassium hydroxide or aqueous sodium hydroxide, or using a mixture of hydrofluoric acid and nitric acid. In addition, a step in which the substrate is washed with a mixture of hydrochloric acid and hydrogen peroxide may be added to remove heavy metals such as iron adhering to the substrate surface. An antireflective textured surface is sometimes formed thereafter using, for example, an aqueous alkali solution such as aqueous potassium hydroxide or aqueous sodium hydroxide. This gives the substrate, 10.

Figure 1B:
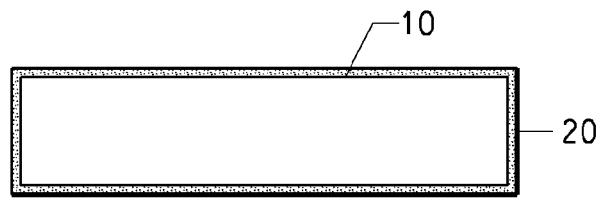
Figure 1C:
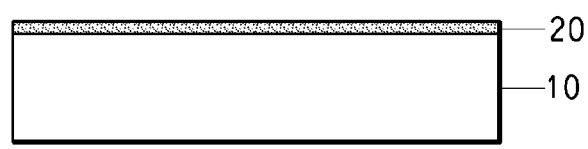

Next, referring to FIG. 1(b), when the substrate used is a p-type substrate, an n-type layer is formed to create a p-n junction. The method used to form such an n-type layer may be phosphorus (P) diffusion using phosphorus oxychloride ($POCl_3$). The depth of the diffusion layer in this case can be varied by controlling the diffusion temperature and time, and is generally formed within a thickness range of about 0.3 to 0.5 μm. The n-type layer formed in this way is represented in the diagram by reference numeral 20. Next, p-n separation on the front and back sides may be carried out by the method described in the background of the invention. These steps are not always necessary when a phosphorus-containing liquid coating material such as phosphosilicate glass (PSG) is applied onto only one surface of the substrate by a process, such as spin coating, and diffusion is effected by annealing under suitable conditions. Of course, where there is a risk of an n-type layer forming on the back side of the substrate as well, the degree of completeness can be increased by employing the steps detailed in the background of the invention.

A less common alternative device design reverses the polarity of the substrate (base) to n-type. A p-type diffusion layer is grown using suitable dopant (e.g. Boron).

Figure 1D:
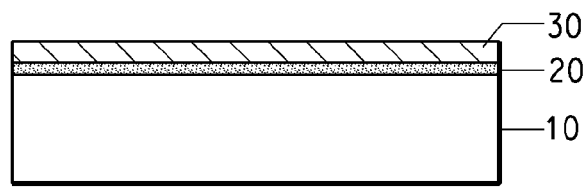

Next, in FIG. 1(d), a silicon nitride film or other insulating films including $SiN_x$:H (i.e., the insulating film includes Hydrogen for passivation during subsequent firing processing) film, titanium oxide film, and silicon oxide film, 30, which functions as an antireflection coating is formed on the above-described n-type diffusion layer, 20. This silicon nitride film, 30, lowers the surface reflectance of the solar cell to incident light, making it possible to greatly increase the electrical current generated. The thickness of the silicon nitride film, 30, depends on its refractive index, although a thickness of about 700 to 900 Å is suitable for a refractive index of about 1.9 to 2.0.

This silicon nitride film may be formed by a process such as low-pressure chemical vapor deposition (CVD), plasma CVD, or sputtering physical vapor deposition (PVD), or thermal CVD. When thermal CVD is used, the starting materials are often dichlorosilane ($SiCl_2H_2$) and ammonia ($NH_3$) gas, and film formation is carried out at a temperature of at least 700° C. When thermal CVD is used, pyrolysis of the starting gases at the high temperature results in the presence of substantially no hydrogen in the silicon nitride film, giving a compositional ratio between the silicon and the nitrogen of $Si_3N_4$ which is substantially stoichiometric. The refractive index falls within a range of substantially 1.96 to 1.98. Hence, this type of silicon nitride film is a very dense film whose characteristics, such as thickness and refractive index, remain unchanged even when subjected to heat treatment in a later step. The starting gas used when film formation is carried out by plasma CVD is generally a gas mixture of $SiH_4$ and $NH_3$. The starting gas is decomposed by the plasma, and film formation is carried out at a temperature of 300 to 550° C. Because film formation by such a plasma CVD process is carried out at a lower temperature than thermal CVD, the hydrogen in the starting gas is present as well in the resulting silicon nitride film. Also, because gas decomposition is effected by the plasma, another distinctive feature of this process is the ability to greatly vary the compositional ratio between the silicon and nitrogen. Specifically, by varying such conditions as the flow rate ratio of the starting gases and the pressure and temperature during film formation, silicon nitride films can be formed at varying compositional ratios between silicon, nitrogen and hydrogen, and within a refractive index range of 1.8 to 2.5. Hydrated silicon nitride films can also be deposited by plasma based sputtering physical vapor deposition technique while introducing hydrogen gas into the plasma during deposition. By selecting the process gases, target material, electrical bias to the target and/or substrate, background pressure, and substrate temperature similar control over the film properties can be obtained with sputtering PVD as with PECVD. When a film having such properties is heat-treated in a subsequent step, the refractive index may change before and after film formation due to such effects as hydrogen elimination in the electrode firing step. In such cases, the silicon nitride film required in a solar cell can be obtained by selecting the film-forming conditions after first taking into account the changes in film qualities that will occur as a result of heat treatment in the subsequent step.

In FIG. 1(d), a titanium oxide film may be formed on the n-type diffusion layer, 20, instead of the silicon nitride film, 30, functioning as an antireflection coating. The titanium oxide film is formed by coating a titanium-containing organic liquid material onto the n-type diffusion layer, 20, and firing, or by thermal CVD. It is also possible, in FIG. 1(d), to form a silicon oxide film on the n-type diffusion layer, 20, instead of the silicon nitride film 30 functioning as an antireflection layer. The silicon oxide film is formed by thermal oxidation, thermal CVD or plasma CVD.

Figure 1E:
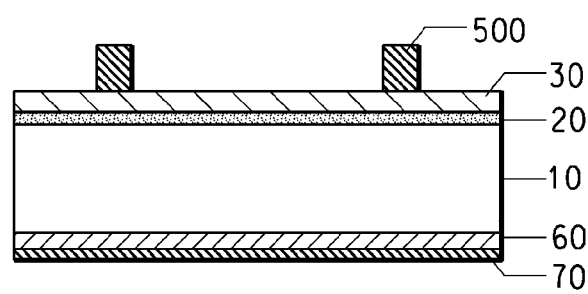

Next, electrodes are formed by steps similar to those shown in FIGS. 10(e) and (f). That is, as shown in FIG. 1(e), aluminum paste, 60, and back side silver or silver/aluminum paste, 70, are screen printed onto the back side of the substrate, 10, as shown in FIG. 1(e) and successively dried. In addition, a front electrode-forming silver paste, 500, is screen printed onto the silicon nitride film, 30, in the same way as on the back side of the substrate, 10, following which drying and firing are carried out in an infrared furnace at a set point temperature range of 700 to 975° C., for example, for a period of from one minute to more than ten minutes while passing through the furnace a mixed gas stream of oxygen and nitrogen.

Figure 1F:
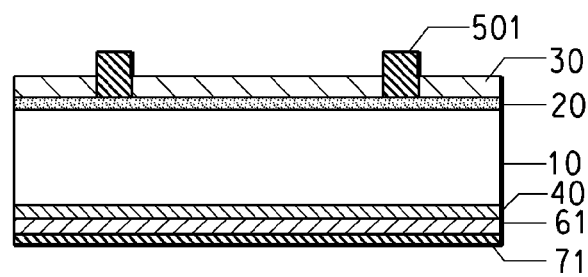

As shown in FIG. 1(f), during firing, aluminum diffuses as an impurity from the aluminum paste into the silicon substrate, 10, on the back side, thereby forming a p+ layer, 40, containing a high aluminum dopant concentration. Firing converts the dried aluminum paste, 60, to an aluminum back electrode, 61. The back side silver or silver/aluminum paste, 70, is fired at the same time, becoming a silver back electrode, 71. During firing, the boundary between the back side aluminum and the back side silver assumes the state of an alloy, thereby achieving electrical connection. Most areas of the back electrode are occupied by the aluminum electrode, partly on account of the need to form a p+ layer, 40. At the same time, because soldering to an aluminum electrode is impossible, the silver or silver/aluminum back electrode is formed on limited areas of the back side as an electrode for interconnecting solar cells by means of copper ribbon or the like.

On the front side, the front electrode silver paste, 500, of the invention includes silver, glass frit, organic vehicle, optionally Zn-containing additive, and optionally inorganic additives, and is capable of reacting and penetrating through the silicon nitride film, 30, during firing to achieve electrical contact with the n-type layer, 20 (fire through). This fired-through state, i.e., the extent to which the fired front electrode silver paste, 501, melts and passes through the silicon nitride film, 30, depends on the quality and thickness of the silicon nitride film, 30, the composition of the front electrode silver paste, and on the firing conditions. The conversion efficiency and moisture resistance reliability of the solar cell clearly depend, to a large degree, on this fired-through state.

In the reverse polarity device design (n-type substrate/base), the front electrode silver paste of the invention reacts with and penetrates any passivating dielectric film such as silicon nitride on the n-type surface to make electrical contact.

EXAMPLES

The thick film composition(s) of the present invention are described herein below in Table II-IV, and VI with performance data shown in FIGS. 2-3 and 6.

Paste Preparation & Printing Semiconductor Substrates

High Performance silver pastes containing a range of glass frit and silver powders were evaluated in test cells. Paste preparations were, in general, accomplished with the following procedure: The appropriate amount of solvent, organic vehicle and surfactant was weighed then mixed in a mixing can for 15 minutes, then glass frits and optionally metal additives were added and mixed for another 15 minutes. Since Ag is the major part of the solids of the present invention, it was added incrementally to ensure better wetting. When well mixed, the paste was repeatedly passed through a 3-roll mill for at progressively increasing pressures from 0 to 400 psi. The gap of the rolls was adjusted to 1 mil. The degree of dispersion was measured by fineness of grind (FOG). A typical FOG value is generally equal to or less than 20/10 for conductors.

The conductor paste was screen printed using known procedures to form suitable electrode patterns on the front side of a suitable device wafer, as described herein. The thickness of the front side conductor can range broadly in its dried layer thickness. In an embodiment, thicker layers may be printed in order to minimize electrode resistive loss. In an example of high printed thickness embodiment, the dried paste may range from 30-50 microns, and reduce in thickness dimension by 30-50% following the firing process. In a non-limiting example of the high printed thickness embodiment, the fired electrode thickness may range from 10-25 microns. In a low-thickness range embodiment, a dried paste thickness of 18-30 microns is contemplated. Upon firing the thickness may be reduced by 30-50%, for example. In a non-limiting example of the low printed thickness embodiment, the fired electrode thickness may range from 6-15 microns.

Test Procedure-Efficiency

The solar cells built according to the method described above were placed in a commercial IV tester for measuring efficiencies (ST-1000). The Xe Arc lamp in the IV tester simulated the sunlight with a known intensity and radiated the front surface of the cell. The tester used a four contact method to measure current (I) and voltage (V) at approximately 400 load resistance settings to determine the cell's I-V curve. Both fill factor (FF) and efficiency (Eff) were calculated from the I-V curve.

Test Procedure-Adhesion

After firing, a solder ribbon (copper coated with 96.5 Sn/3.5 Ag) was soldered to the bus bars printed on the front of the cell. Solder reflow was typically achieved at 365° C. for 5 seconds. Flux used was non activated Alpha-100 or MF200. The soldered area was approximately 2 mm×2 mm. The adhesion strength was obtained by pulling the ribbon at an angle of 90° to the surface of the cell. Normalized adhesion strength was calculated to compare vs. a minimum adhesion value of 300 g.

Efficiency Data

The composition of glass frit and ZnO given in Table II are given in percent total thick film composition (paste). Data for this series of pastes is shown in FIG. 2 with each box corresponding to 5 cells/(Process Set Temperature). The data was taken at three process temperatures: 900, 920 and 940 Celsius. Glass 21, glass 22, glass 25, and glass 31 from Table I were tested. Four paste lots of glass 22 (22-1, 22-2, 22-3, and 22-4) are shown.

Additional glass materials were tested for photovoltaic efficiency in Table V. FIG. 3 is a plot of the formulations shown in Table II for Glass #22 and denoted as Paste 22. The data on median performance efficiency was plotted with data for a typical commercial control composition. As can be seen from the plot the composition shows a broad thermal range for firing with greater than 14.5% efficiency from the cut cell test.

Table VI provides formulation data for the photovoltaic energy efficiency for a series of conductor paste samples based upon glass #11 with variation in ZnO additive and process temperature conditions, 825, 850, and 875 C. The conductor paste was printed with an unfired or "green" thickness of 16-24 microns. FIG. 6 shows a box plot of the photovoltaic efficiency data for the test samples. They are denoted as 11-1, and 11-2 for the first and second formulations in the Table VI listing of the formulations. In this series of test conditions, the 11-3 sample processed at 825 C showed the highest energy efficiency.

Effect of ZnO Loading and Ag Content:

The effect of ZnO loading and Ag powder type on median efficiency % was tested as described above, and the results are shown in Table IV. Frit %, ZnO %, and Ag % in Table IV are the weight % of the total composition.

Thermal Expansion Measurements of Glass Materials as Evidence of Glass Immiscibility:

The thermal expansion (ΔL/L) and the coefficient of thermal expansion (CTE) of Glass 12 and Glass 22 were measured by preparing glass bars of approximate dimensions: ⅛"×⅛"×2" prepared from hydraulically pressed powder, then fused at 625° C. and slow cooled in a closed furnace. The samples were inserted in a fused silica horizontal dilatometer made by Anter Corp., Pittsburgh, Pa. as model 1091 and were then measured using the equipment which had been previously calibrated against a sapphire thermal expansion secondary standard. The samples were heated at a 3.5° C./min heating rate with data taken by digital gages. FIG. 4 shows a plot of both thermal expansion and CTE for three glasses. Glass 12 and 22 from Table 1 and a Glass A having a similar composition but having no fluoride content and hence is a typical homogeneous glass for comparative reference. The effect of the glass immiscibility is apparent in the characteristics shown in the 400-550° C. temperature range.

Sintering and Flow Behavior of Glass Materials as Measured Through Linear Shrinkage Using a Thermo-Mechanical Analyzer (TMA):

The TMA and DTA are commonly used as an index to the flow properties of glass powders. Both measurements are used to obtain kinetic information on transformational states in the tested material. The TMA commonly measures dimension changes in powder compacts of glass and other materials. The DTA measures thermal changes in a sample relative to a uniform heating reference material, typically alumina powder. Thermo-mechanic analysis (TMA) measurements using a TA instruments Q400 using a static force of 0.05 Newton on a pressed powder pellet 2.0-2.5 mm in thickness were measured for selected samples. The samples were heated at a rate of 10° C./min. from room temperature to a temperature where viscous flow dominated the deformation behavior. The $T_g$ was estimated by the point where the pellets shows an onset of shrinkage, i.e. sintering onset temperature, and coincides with a glass viscosity of approximately log(eta) ~12-13 poise. In many glasses, the shrinkage rate is seen to show an inflection in the rate of shrinkage as it transitions from powder sintering to viscous flow. This inflection is not a precise measurement of physical property, however it will typically pass through the temperature of the ASTM softening point (log(glass viscosity)=7.6 poise). The point where glass flow begins to dominate the pellet shrinkage is characterized as glass flow causing a steep rate of shrinkage deformation. Most glasses of Table 1 exhibited a glass flow onset from 300° C. to 600° C. as seen in FIG. 5. Due to the fluorine content of the glasses described herein, the observation of glass flow was delayed and manifested by a plateau in the observed TMA data. As shown in FIG. 5, a non-fluorinated glass, Glass A, exhibited a continuous shrinkage, or glass flow, with increasing temperature above 550° C. whereas Glass 22 with 1.67 wt % fluorine (Table VII) exhibited no flow at temperature greater than ~525° C. and Glass 12 with twice the fluorine content (3.33 wt % fluorine from Table VI) exhibited a plateau at lower % shrinkage in the same temperature range. These plateau observed in FIG. 5 are the result of glass immiscibility creating a rigid glass condition as the harder, siliceous phase separates and encapsulates the softer glass phase while arresting the flow of the more cationic rich, softer glass phase.

Evaluation of Experimental Silver Paste on Multicrystalline and Monocrystalline Si Wafers A series of front side experimental silver pastes were made and evaluated on multicrystalline and monocrystalline Si wafers that exhibit improved electrical performance relative to commercial silver paste PV14X. A combination of process experiments and electrical measurements were performed. Several electrical measurement methods were applied: I-V, Suns Voc, Corescan, and Line resistance. Line dimensions and soldered adhesion were also measured. These studies provided insights into the various paste designs.

Materials Selection

High performance silver pastes containing a range of glass frit and silver powders (see Table VIII) were prepared and evaluated in test cells. The cells all had the same Al BSF paste printed and dried on the back surface prior to printing, drying, and cofiring the silver pastes.

Two silicon wafer types were used in the evaluation: 165 mm textured multicrystalline (mc Si) having emitter sheet resistance ($R_e$) of 60 Ω/sq. and 125 mm textured monocrystalline (mono Si) having $R_e$ of 70 Ω/sq.

Printing

Pastes were printed using a 325 mesh stainless steel screen having wire diameter of 23 microns. Finger openings were 100 microns giving printed finger widths ranging from 124 microns to 136 microns. Emulsion thickness was 30 microns over the mesh.

Firing

The cells were co fired in an RTC 6 zone IR furnace set to 5 different peak temperatures in the last zone. FIG. 7 shows the measured temperature-time profiles for the 5 firing conditions.

The peak measured temperatures ranged from 700 C to 760 C. This range is 40 C less than the set point range. This was a result of a high set point (800 C) in the zone preceding the peak zone.

Figure 13C:
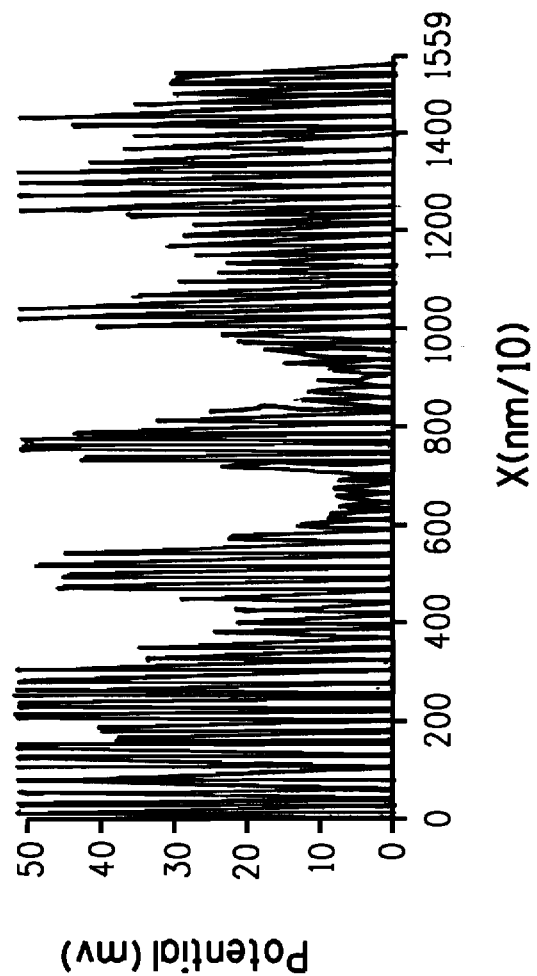
Figure 14A:
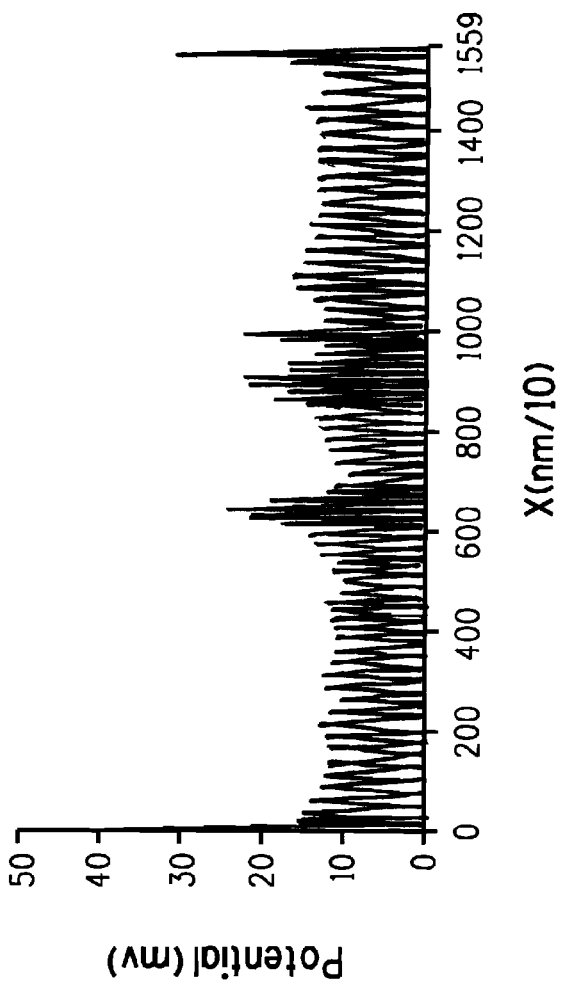
Figure 14B:
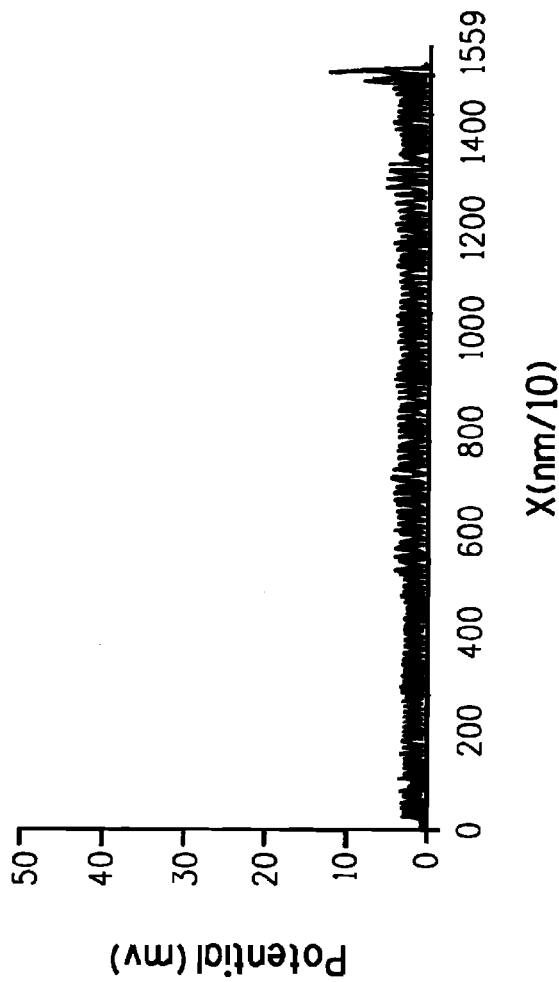
Figure 15A:
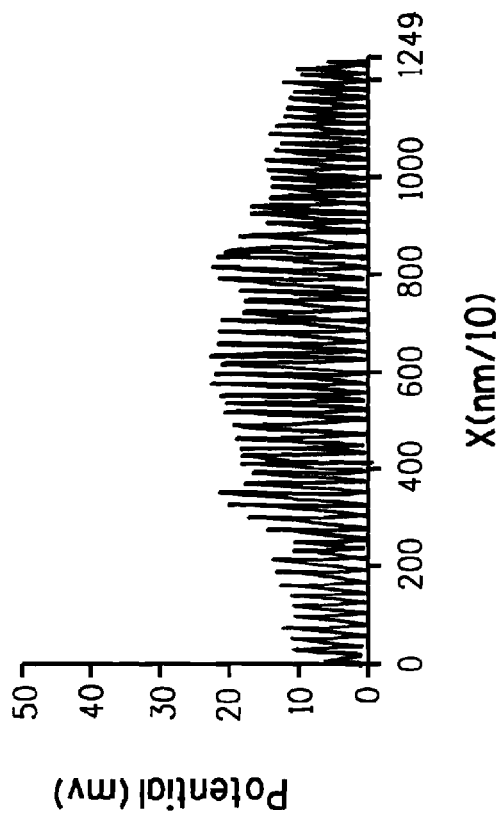
Figure 15B:
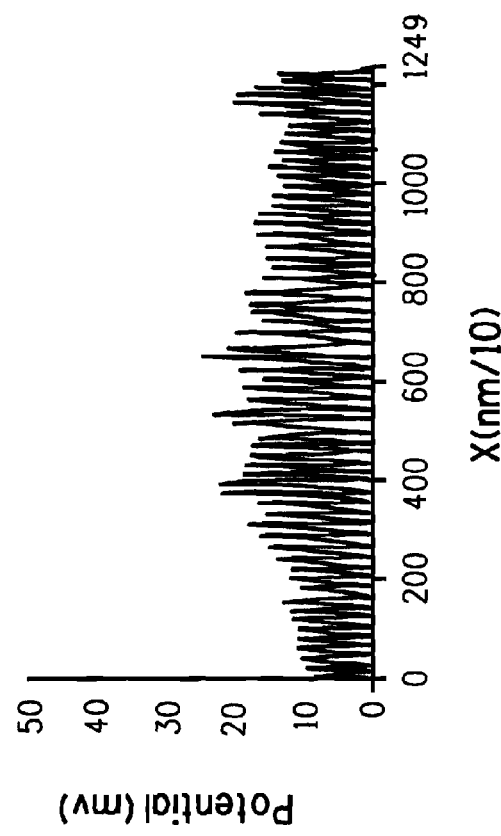
Figure 16A:
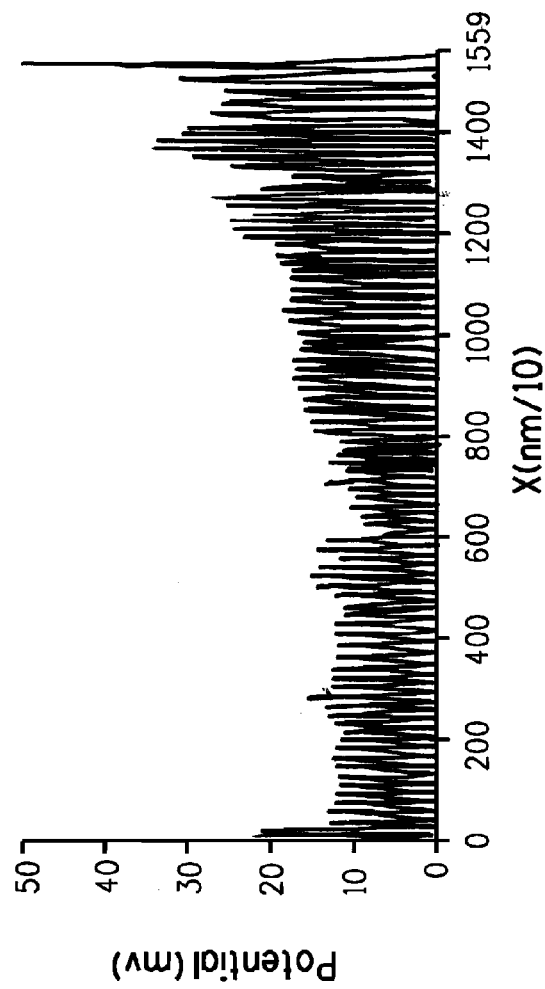
Figure 16B:
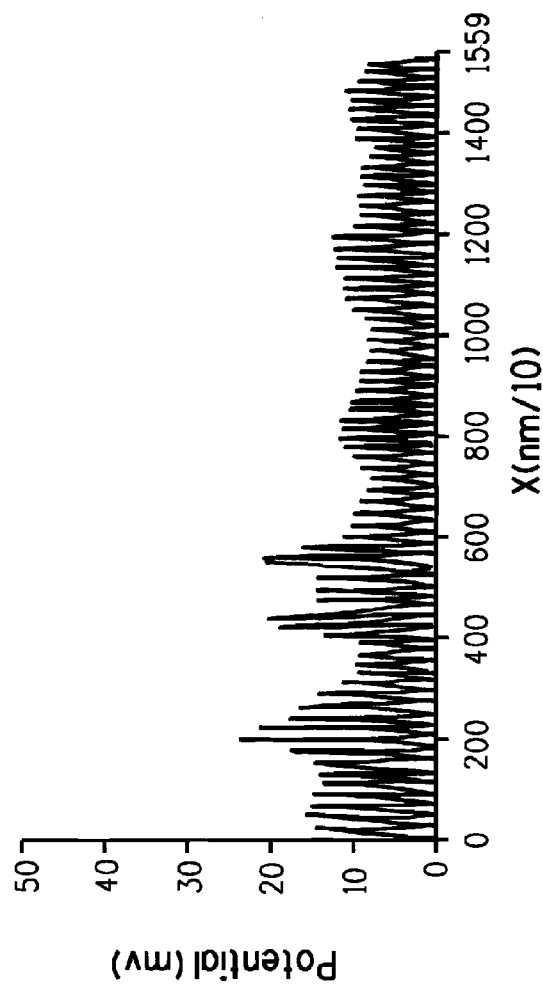
Figure 16C:
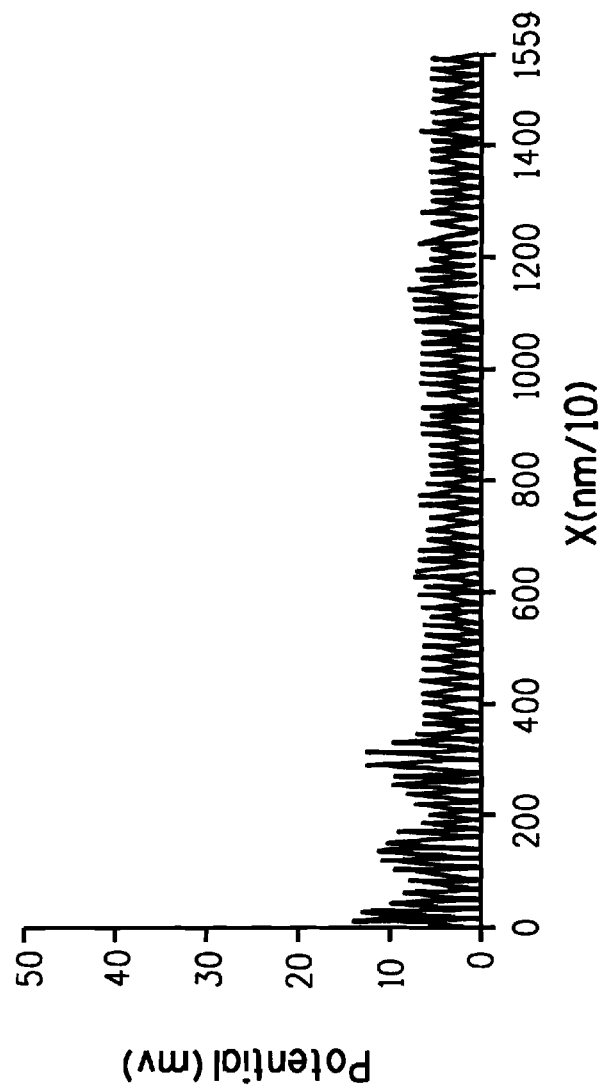

Another important effect of the two hot zones was an increase in the high temperature duration. For example, the respective times above 600 C and 650 C were 5 and 3.5 seconds for the 835 C setting. This high thermal budget led to emitter damage effects for some pastes in the third experimental stage.
Results
  Electrical Data
  Cells were made and tested [ST-1000; Telecom STV] in three successive experimental stages. Table VIII lists the pastes, key ingredients, and relative cell efficiencies of each stage.
Table VIII, shows the averaged data of 5 cells fired at the optimum condition (835 or 860 C set points; 720 or 730 C measured peak).
  The soft frits were followed through all stages, as they demonstrated the more consistent improvement through the first two stages.
  Variations are evident with paste, stage, and wafer type. Some pastes exhibited more sensitivity than others. This demonstrates both the suitability and robustness of each. Electrical data (Voc and Suns Voc) indicate Stage 3 firing was hotter than Stages 1 and 2. Paste B, containing silver 2, responded the most to this change. Variation at each condition across the firing range are shown in FIG. 8.
  The responses of the pastes A, B, and C on monocrystalline Si are shown in FIG. 9.
The Jo2 of the pastes on both cell types were measured with a Suns Voc tester [Sinton Consulting] shown in FIG. 10.
FIG. 11 shows the average fill factor of stage 3 cells.
The Voc decrease at high temperatures for all monocrystalline cells and with Pastes A and B on the multicrystalline Si (FIG. 12) was another negative impact of the emitter and junction region damage revealed by the Jo2 data. It also indicates the high $R_e$ monocrystalline wafers have a shallower emitter.
The Jsc of the four pastes of Stage 3 varied slightly with Paste B and PV14X slightly higher than the other two pastes (Table IX). These data indicate Paste B and PV14X have less shading loss. Line width data bear this out (see Table II).
  Contact Resistance Mapping
High performance was achieved by minimizing contact resistance (Rc) while avoiding junction damage (low Jo2). We used the Corescan [from SunLab] to map Rc (measured V of localized Isc) for various cells. FIG. 13 shows the progression of Paste A's Rc on mc-Si wafers with increasing temperature across the firing range. The improvement achieved with the pastes fired at optimal temperature (860 C) is shown in FIGS. 8 and 9.
  In FIG. 14 the Rc is both lower and more uniform. In FIG. 15 Rc is more uniformly low.
A uniformly low Rc was measured on a 80 Ohm/square emitter mc-Si cell calculated by a similar paste to those herein. (Gen 3 in FIG. 16).
  Adhesion Measurements
  Adhesion of 62/36/2 Sn/Pb/Ag coated Cu ribbons was measured after coating the ribbons with no-clean flux (MF-200) and reflowing manually with solder iron maintained at 325 degrees C.
  The cells were reinforced prior to pulling ribbons at 90 degrees from the cell to give a force vs. distance chart from which average adhesion in N was calculated.
  FIG. 17 (Soldered Adhesion) shows all pastes achieved average adhesion above the minimum required value of 2.5N (8 to 10 pulls per paste).
  Line Dimensions
  All pastes printed and fired to similar finger thickness with the exception of Paste B which achieved a higher thickness and aspect ratio. Paste B and PV14X achieved a narrower line width which correlated with their higher Jsc.
  The finger R values were measured from busbar to busbar. The higher relative R values of pastes A-C indicate they have a lower relative density.
  SEM Photomicrographs
  Finger size, shape, and density are shown in FIG. 18 comparing Paste A with PV14X. The lower density calculated from the finger R and cross section values isn't evident in these photographs. Differences in thickness and width are attributed to expected variation along fingers.
Improved cell efficiency has been achieved by decreasing Rc to lightly doped cells with $R_e$ ranging from 60 to 80 Ω/sq. Different paste designs having different SiNx etch activity led to variations in Rc and Jo2. These differences were increased by increased thermal budget.

TABLE I

Glass Compositions in Weight Percent

| ID # | SiO2 | Al2O3 | PbO | ZrO2 | B2O3 | CaO | ZnO | CuO | Na2O | Li2O | Bi2O3 | P2O5 | TiO2 | NaF | PbF2 | Density g/cc |
|---|---|---|---|---|---|---|---|---|---|---|---|---|---|---|---|---|
| 1 | 23.34 | 2.64 | 17.31 | 3.51 | 18.71 | | 11.61 | 1.75 | | | | | | | 21.13 | 3.81 |
| 2 | 21.84 | 0.38 | 21.48 | | 7.41 | | | | | | 32.50 | | 5.79 | | 10.61 | 4.69 |
| 3 | 32.54 | 3.77 | 23.35 | | 10.71 | 10.02 | | | | | | | | | 19.62 | 3.78 |
| 4 | 20.94 | 1.97 | 25.93 | 7.95 | 17.98 | 10.50 | 2.05 | | | | | | | | 12.66 | 3.80 |
| 5 | 25.62 | 0.36 | 28.63 | | 7.07 | | | | | | 6.41 | | 5.53 | | 26.37 | 4.54 |
| 6 | 21.73 | 0.38 | 30.02 | | 7.37 | | | | | | 6.69 | | 5.76 | | 28.05 | 4.83 |
| 7 | 14.64 | 6.46 | 30.63 | | 14.60 | | | | | | | | | | 33.68 | 4.61 |
| 8 | 19.88 | 0.40 | 33.23 | 1.74 | | | 18.93 | | | | | | | | 25.81 | 5.51 |
| 9 | 4.65 | | 33.45 | | 3.96 | | | | | | 51.48 | | | | 6.45 | 7.45 |
| 10 | 23.53 | 0.39 | 34.49 | | 7.59 | | | | | | 17.09 | | 5.62 | | 11.29 | 4.68 |
| 11 | 11.79 | 2.71 | 36.50 | 1.51 | | | 19.96 | | | | | 3.48 | | | 24.06 | 5.63 |
| 12 | 21.87 | 0.38 | 36.57 | | 7.42 | | | | | | 6.73 | | 5.80 | | 21.24 | 4.81 |
| 13 | 18.18 | 8.11 | 37.90 | | | | 21.82 | | | | | | | | 13.99 | 5.22 |
| 14 | 34.31 | | 38.59 | 3.04 | 3.03 | 0.60 | | 3.25 | 0.91 | | | | 5.48 | | 10.79 | 4.07 |
| 15 | 14.82 | 0.38 | 40.96 | | 5.91 | | | | | | 22.73 | | 3.59 | | 11.62 | 5.70 |
| 16 | 34.99 | 5.09 | 42.87 | | 3.36 | 5.22 | | | | | | | | | 8.46 | 4.04 |
| 17 | 5.02 | | 44.29 | | 2.75 | 3.07 | | | | | 38.41 | | | | 6.45 | 7.39 |
| 18 | 25.83 | 0.37 | 44.43 | | 7.13 | | | | | | 6.47 | | 5.57 | | 10.21 | 4.52 |
| 19 | 23.92 | 0.37 | 45.58 | | 7.31 | | | | | | 6.63 | | 5.72 | | 10.47 | 4.65 |
| 20 | 25.40 | 0.44 | 46.66 | | 8.61 | | 2.67 | | | | | | 4.56 | | 11.66 | 4.46 |
| 21 | 14.87 | 6.56 | 46.66 | | 14.82 | | | | | | | | | | 17.10 | 4.47 |
| 22 | 22.08 | 0.38 | 46.68 | | 7.49 | | | | | | 6.79 | | 5.86 | | 10.72 | 4.83 |

TABLE I-continued

Glass Compositions in Weight Percent

| ID # | SiO2 | Al2O3 | PbO | ZrO2 | B2O3 | CaO | ZnO | CuO | Na2O | Li2O | Bi2O3 | P2O5 | TiO2 | NaF | PbF2 | Density g/cc |
|---|---|---|---|---|---|---|---|---|---|---|---|---|---|---|---|---|
| 23 | 22.72 | 0.40 | 48.03 | | 7.70 | | | 0.50 | 0.48 | | 6.99 | | 2.14 | | 11.03 | 4.88 |
| 24 | 22.07 | 0.38 | 50.97 | | 7.48 | | | | | | 6.79 | | 5.85 | | 6.45 | 4.85 |
| 25 | 29.32 | 3.13 | 51.55 | | 3.06 | 2.57 | 2.74 | | | | | | | | 7.64 | 4.59 |
| 26 | 22.18 | 0.39 | 51.81 | | 7.52 | | | | | | 6.83 | | 5.89 | | 5.39 | 4.82 |
| 27 | 24.54 | 0.43 | 51.89 | | | | | | | | 7.55 | | 6.51 | | 9.08 | 5.21 |
| 28 | 22.14 | 0.39 | 53.34 | | 7.51 | | | | | | | | 5.87 | | 10.75 | 4.84 |
| 29 | 30.61 | 2.55 | 55.02 | | 1.83 | | 2.70 | | | | | | | | 7.29 | 4.63 |
| 30 | 7.85 | 3.01 | 60.68 | 0.76 | 2.31 | | | | | | | | 19.77 | | 5.61 | 5.52 |
| 31 | 9.50 | 1.46 | 63.94 | | 13.05 | | 3.00 | | | | | | | | 9.04 | 5.59 |
| 32 | 1.10 | 0.56 | 82.55 | | 10.80 | | | | | | | | | | 4.99 | 6.75 |
| 33 | 1.10 | | 82.70 | | 11.20 | | | | | | | | | | 5.00 | 6.20 |
| 34 | | | 83.08 | | 11.91 | | | | | | | | | | 5.00 | 6.85 |
| 35 | 8.80 | | 70.40 | | | | | | | | | | | | 12.00 | 6.35 |
| 36 | 11.18 | 3.96 | 73.06 | 1.04 | | | | | | | | | 10.76 | | | |
| 37 | 11.06 | 3.92 | 62.49 | 1.03 | | | | | | | | | 21.49 | | | |
| 38 | 18.47 | 1.98 | 48.99 | | 3.52 | 0.52 | 20.25 | | 0.59 | | | | 0.40 | | 5.28 | |

TABLE II

Testing of Glass Frit Component of Thick Film Silver Paste Formulation

| Glass ID No. | % Frit | % ZnO | Ag (%) | Organic Vehicle |
|---|---|---|---|---|
| Glass 22 | 1.4 | 6.5 | 80 | 12.1 |
| Glass 25 | 1.4 | 6.5 | 80 | 12.1 |
| Glass 21 | 1.4 | 6.5 | 80 | 12.1 |
| Glass 31 | 1.4 | 6.5 | 80 | 12.1 |
| Glass 33 | 1.4 | 6.5 | 80 | 12.1 |

TABLE III

Glass Composition and Firing Temperature Effect on Cell Performance

| | | Efficiency (%) | | |
|---|---|---|---|---|
| Glass ID | Peak T [C.] | Mean | Max | Min |
| 21 | 940 | 12.0 | 12.7 | 11.1 |
| 21 | 920 | 12.5 | 13.0 | 11.2 |
| 21 | 900 | 12.8 | 13.5 | 11.5 |
| 22-1 | 940 | 14.2 | 15.0 | 13.2 |
| 22-1 | 920 | 14.5 | 15.0 | 14.1 |
| 22-1 | 900 | 14.4 | 15.0 | 13.9 |
| 22-2 | 940 | 14.3 | 14.7 | 13.4 |
| 22-2 | 920 | 14.2 | 14.8 | 13.3 |
| 22-2 | 900 | 14.5 | 14.8 | 13.9 |
| 22-3 | 940 | 14.6 | 15.4 | 14.2 |
| 22-3 | 920 | 14.6 | 14.9 | 14.3 |
| 22-3 | 900 | 14.5 | 14.9 | 14.3 |
| 22-4 | 940 | 14.3 | 15.0 | 13.9 |
| 22-4 | 920 | 14.5 | 15.1 | 14.1 |
| 22-4 | 900 | 14.6 | 15.0 | 14.0 |
| 25 | 940 | 14.1 | 14.7 | 12.8 |
| 25 | 920 | 14.6 | 15.0 | 13.9 |
| 25 | 900 | 14.0 | 14.6 | 13.7 |
| 31 | 940 | 13.3 | 13.8 | 12.8 |
| 31 | 920 | 14.4 | 14.7 | 14.0 |
| 31 | 900 | 14.6 | 14.9 | 14.2 |
| 33 | 940 | 14.1 | 14.7 | 13.3 |
| 33 | 920 | 14.5 | 14.6 | 14.2 |
| 33 | 900 | 14.2 | 14.5 | 13.8 |

Notes:
Firing T range is wider than shown (860 to 940 C.)
Firing T range depends on time in furnace (belt conveyor speed)

TABLE IV

Effect of ZnO Loading and Ag Powder Type on median efficiency %

| Paste | Glass ID No. | % Frit | % ZnO | Ag (%) | Ag Powder | Organic Vehicle | Median Eff (%) |
|---|---|---|---|---|---|---|---|
| 1-X | Glass 22 | 1.4 | 6.5 | 80 | A | 12.1 | 14.6-14.9 |
| 6-X | Glass 22 | 1.4 | 6.5 | 80 | B | 12.1 | 15.0-15.2 |
| 7 | Glass 22 | 1.4 | 3.0 | 80 | A | 15.6 | 15.0 |

TABLE V

Testing of Glass Frit Component of Thick Film Silver Paste Formulation - Additional Testing

| Glass ID No. | % Frit | % ZnO | Ag (%) | Organic Medium | Mean Eff (%) |
|---|---|---|---|---|---|
| Glass 2 | 1.4 | 6.5 | 80 | 12.1 | 14 |
| Glass 5 | 2.1 | 5.8 | 80 | 12.1 | 14.7 |
| Glass 6 | 1.4 | 6.5 | 80 | 12.1 | 13.8 |
| Glass 8 | 1.4 | 6.5 | 80 | 12.1 | 12.9 |
| Glass 10 | 1.4 | 6.5 | 80 | 12.1 | 14 |
| Glass 11 | 1.4 | 6.5 | 80 | 12.1 | 14.1 |
| Glass 12 | 1.4 | 6.5 | 80 | 12.1 | 14.5-14.8 |
| Glass 13 | 1.4 | 6.5 | 80 | 12.1 | 13.8 |
| Glass 14 | 1.4 | 6.5 | 80 | 12.1 | 13.6 |
| Glass 15 | 1.4 | 6.5 | 80 | 12.1 | 14.2 |
| Glass 18 | 1.4 | 6.5 | 80 | 12.1 | 14.4 |
| Glass 19 | 1.4 | 6.5 | 80 | 12.1 | 14.1 |
| Glass 20 | 2.1 | 5.8 | 80 | 12.1 | 14.7 |
| Glass 22 | 1.4 | 6.5 | 80 | 12.1 | 14.1-15.2 |
| Glass 23 | 2.1 | 5.8 | 80 | 12.1 | 14.8 |
| Glass 24 | 1.4 | 6.5 | 80 | 12.1 | 13.8 |
| Glass 27 | 2.1 | 5.8 | 80 | 12.1 | 14.3 |
| Glass 28 | 1.4 | 6.5 | 80 | 12.1 | 14 |
| Glass 30 | 1.4 | 6.5 | 80 | 12.1 | 14.1 |
| Glass 34 | 1.4 | 6.5 | 80 | 12.1 | 13.8 |

TABLE VI

Paste Formulations for Silver Conductor Paste of FIG. 6.

| Glass ID No. | % Frit | % ZnO | Ag (%) | Organic Medium |
|---|---|---|---|---|
| Glass 11 | 2.5 | 4.0 | 79.7 | 13.8 |
| Glass 11 | 2.0 | 5.0 | 79.2 | 13.8 |

TABLE VI-continued

Paste Formulations for Silver Conductor Paste of FIG. 6.

| Glass ID No. | % Frit | % ZnO | Ag (%) | Organic Medium |
|---|---|---|---|---|
| Glass 11 | 2.0 | 4.5 | 79.7 | 13.8 |
| Glass 11 | 2.0 | 3.5 | 80.7 | 13.8 |
| Glass 11 | 6.0 | 0 | 80.2 | 13.8 |

TABLE IX

Fired Finger Dimensions (microns)

| Paste | A | B | C | PV14X |
|---|---|---|---|---|
| Thickness | 14.3 | 16.8 | 14.4 | 14.1 |
| Width | 138 | 124 | 136 | 123 |
| Aspect Ratio | 0.10 | 0.14 | 0.11 | 0.12 |
| Rel. Jsc | 99.7 | 100.3 | 99.7 | 100.0 |
| Rel. $R_{bus-bus}$ | 106 | 100 | 107 | 100 |

TABLE VII

Glass Compositions in Free Fluorine Weight Percent wt % F only Frit composition

| ID # | SiO2 | Al2O3 | PbO | ZrO2 | B2O3 | CaO | ZnO | CuO | Na2O | Li2O | Bi2O3 | P2O5 | TiO2 | F | Al2O3 + TiO2 + ZrO2 | alkali |
|---|---|---|---|---|---|---|---|---|---|---|---|---|---|---|---|---|
| 1 | 23.34 | 2.64 | 35.17 | 3.51 | 18.71 | | 11.61 | 1.75 | | | | | | 3.27 | 6.15 | 0.00 |
| 2 | 21.84 | 0.38 | 30.44 | | 7.41 | | | | | | 32.50 | | 5.79 | 1.64 | 6.17 | 0.00 |
| 3 | 32.54 | 3.77 | 39.93 | | 10.71 | | 10.02 | | | | | | 3.04 | | 3.77 | 0.00 |
| 4 | 20.94 | 1.97 | 36.63 | 7.95 | 17.98 | | 10.50 | 2.05 | | | | | | 1.96 | 9.93 | 0.00 |
| 5 | 25.62 | 0.36 | 50.91 | | 7.07 | | | | | | 6.41 | | 5.53 | 4.09 | 5.89 | 0.00 |
| 6 | 21.34 | 0.37 | 54.55 | | 7.24 | | | | | | 6.57 | | 5.66 | 4.27 | 6.03 | 0.00 |
| 7 | 14.64 | 6.46 | 59.08 | | 14.60 | | | | | | | | | 5.22 | 6.46 | 0.00 |
| 8 | 19.88 | 0.40 | 55.04 | 1.74 | | | 18.93 | | | | | | | 4.00 | 2.14 | 0.00 |
| 9 | 4.65 | | 38.91 | | 3.96 | | | | | | 51.48 | | | 1.00 | 0.00 | 0.00 |
| 10 | 23.53 | 0.39 | 44.04 | | 7.59 | | | | | | 17.09 | | 5.62 | 1.75 | 6.01 | 0.00 |
| 11 | 11.79 | 2.71 | 56.82 | 1.51 | | | 19.96 | | | | | 3.48 | | 3.73 | 4.22 | 0.00 |
| 12 | 21.87 | 0.38 | 54.52 | | 7.42 | | | | | | 6.73 | | 5.80 | 3.29 | 6.18 | 0.00 |
| 13 | 18.01 | 8.04 | 50.17 | | | | 21.63 | | | | | | | 2.15 | 8.04 | 0.00 |
| 14 | 34.07 | | 48.07 | 3.02 | 3.01 | | 0.60 | | 3.23 | 0.90 | | | 5.44 | 1.66 | 8.46 | 4.13 |
| 15 | 14.82 | 0.38 | 50.77 | 5.91 | | | | | | | 22.73 | | 3.59 | 1.80 | 9.88 | 0.00 |
| 16 | 34.99 | 5.09 | 50.02 | | 3.36 | | 5.22 | | | | | | 1.31 | | 5.09 | 0.00 |
| 17 | 5.02 | | 49.75 | | 2.75 | | 3.07 | | | | 38.41 | | | 1.00 | 0.00 | 0.00 |
| 18 | 25.83 | 0.37 | 53.06 | | 7.13 | | | | | | 6.47 | | 5.57 | 1.58 | 5.94 | 0.00 |
| 19 | 23.92 | 0.37 | 54.42 | | 7.31 | | | | | | 6.63 | | 5.72 | 1.62 | 6.09 | 0.00 |
| 20 | 25.40 | 0.44 | 56.50 | | 8.61 | | 2.67 | | | | | | 4.56 | 1.81 | 5.00 | 0.00 |
| 21 | 14.87 | 6.56 | 61.10 | | 14.82 | | | | | | | | | 2.65 | 6.56 | 0.00 |
| 22 | 22.08 | 0.38 | 55.74 | | 7.49 | | | | | | 6.79 | | 5.86 | 1.66 | 6.24 | 0.00 |
| 23 | 22.72 | 0.40 | 57.36 | | 7.70 | | | 0.50 | 0.48 | | 6.99 | | 2.14 | 1.71 | 2.54 | 0.99 |
| 24 | 22.07 | 0.38 | 56.42 | | 7.48 | | | | | | 6.79 | | 5.85 | 1.00 | 6.24 | 0.00 |
| 25 | 29.32 | 3.13 | 58.00 | | 3.06 | | 2.57 | 2.74 | | | | | | 1.18 | 3.13 | 0.00 |
| 26 | 22.18 | 0.39 | 56.36 | | 7.52 | | | | | | 6.83 | | 5.89 | 0.83 | 6.27 | 0.00 |
| 27 | 24.54 | 0.43 | 59.56 | | | | | | | | 7.55 | | 6.51 | 1.41 | 6.94 | 0.00 |
| 28 | 22.14 | 0.39 | 62.42 | | 7.51 | | | | | | | | 5.87 | 1.67 | 6.26 | 0.00 |
| 29 | 30.61 | 2.55 | 61.18 | | 1.83 | | 2.70 | | | | | | | 1.13 | 2.55 | 0.00 |
| 30 | 7.85 | 3.01 | 65.42 | 0.76 | 2.31 | | | | | | | | 19.77 | 0.87 | 23.55 | 0.00 |
| 31 | 9.50 | 1.46 | 71.58 | | 13.05 | | 3.00 | | | | | | | 1.40 | 1.46 | 0.00 |
| 32 | 1.10 | 0.56 | 86.77 | | 10.80 | | | | | | | | | 0.77 | 0.56 | 0.00 |
| 33 | 1.10 | | 86.93 | | 11.20 | | | | | | | | | 0.77 | 0.00 | 0.00 |
| 34 | | | 87.31 | | 11.91 | | | | | | | | | 0.78 | 0.00 | 0.00 |
| 35 | 8.80 | | 80.54 | | 8.80 | | | | | | | | | 1.86 | 0.00 | 0.00 |
| 36 | 11.18 | 3.96 | 82.16 | 1.04 | | | | | | | | | | 1.67 | 5.00 | 0.00 |
| 37 | 11.06 | 3.92 | 80.66 | 1.03 | | | | | | | | | | 3.33 | 4.95 | 0.00 |
| 38 | 18.32 | 1.97 | 53.02 | | 3.49 | 0.52 | 20.08 | | 0.22 | 0.59 | | | | 1.82 | 1.97 | 0.81 |
| 39 | 12.29 | 2.82 | 51.86 | 1.57 | | | 23.40 | | | | | | 3.63 | 4.43 | 4.39 | 0.00 |

TABLE VIII

| | | | | 1 | 2 | 3 | |
|---|---|---|---|---|---|---|---|
| Paste | Frit | Frit | Ag | mc Si | mc Si | mc Si | mono Si |
| A | A | Soft | 1 | 100.9 | 100.9 | 101.0 | 101.6 |
| B | A | Soft | 2 | 100.6 | 100.9 | 96.0 | 102.7 |
| C | B | Soft | 1 | 101.5 | 102.1 | 100.2 | 103.9 |
| D | C | Medium | 1 | 100.0 | 101.6 | | |
| E | D | Medium | 1 | 100.8 | 98.9 | | |
| PV14X | E | Hard | 3 | 100.0 | 100.0 | 100.0 | 100.0 |

TABLE IX-continued

Fired Finger Dimensions (microns)

| Paste | A | B | C | PV14X |
|---|---|---|---|---|
| Rel. X-Section Area | 114 | 120 | 113 | 100 |
| Rel. Density | 83 | 83 | 83 | 100 |

What is claimed is:

1. A semiconductor device comprising:
   a semiconductor layer;
   an insulating layer over the semiconductor layer;
   a sintered electrode formed on the side of the insulating layer opposite to the semiconductor layer, the sintered electrode comprising silver, $SiO_2$, $Bi_2O_3$, $PbF_2$, penetrating the insulating layer;

wherein the sintered electrode is formed from a thick film paste comprising:
 a) electrically conductive silver
 b) a glass frit composition comprising 4-26 wt % $SiO_2$, 6-52 wt % $Bi_2O_3$ and 5-29 wt % $PbF_2$, based on wt % of the total glass frit composition; dispersed in
 c) an organic vehicle;

wherein the thick film paste penetrates the insulating layer upon sintering.

2. The semiconductor device of claim 1, wherein the thick film paste further comprises one or more zinc-containing additives.

3. The semiconductor device of claim 1, wherein at least one of the glass frit compositions comprises 18-26 wt % $SiO_2$, based on wt % of the total glass frit composition.

4. The semiconductor device of claim 1, wherein at least one of the glass frit compositions further comprises 20-52 wt % PbO, 0-1 wt % $Al_2O_3$, 2-7 wt % $TiO_2$, and 0-8 wt % $B_2O_3$.

5. The semiconductor device of claim 1, wherein at least one of the glass frit compositions comprises 0-1 wt % BaO.

6. The semiconductor device of claim 1, wherein at least one of the glass frit compositions wherein the composition does not comprise BaO.

7. The semiconductor device of claim 2, wherein the zinc-containing additive comprises ZnO.

8. The semiconductor device of claim 2, wherein the composition comprises 2-8 wt % zinc-containing additive, and 1-3 wt % glass frit, based on the weight of the total composition.

* * * * *